US006621380B2

(12) United States Patent
Takamine

(10) Patent No.: US 6,621,380 B2
(45) Date of Patent: *Sep. 16, 2003

(54) LONGITUDINALLY COUPLED RESONATOR TYPE SURFACE ACOUSTIC WAVE FILTER HAVING NARROW ELECTRODE FINGER PITCH SECTIONS

(75) Inventor: Yuichi Takamine, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 70 days.

This patent is subject to a terminal disclaimer.

(21) Appl. No.: 09/855,246

(22) Filed: May 15, 2001

(65) Prior Publication Data

US 2002/0000898 A1 Jan. 3, 2002

(30) Foreign Application Priority Data

May 22, 2000 (JP) .................................. 2000-150203
Jun. 27, 2000 (JP) .................................. 2000-193299
Mar. 9, 2001 (JP) .................................. 2001-067289

(51) Int. Cl.$^7$ .............................. H03H 9/64; H03H 9/72
(52) U.S. Cl. ...................... 333/195; 333/196; 333/133; 310/313 D
(58) Field of Search ................. 333/193–196, 333/133; 310/313 B, 313 D

(56) References Cited

U.S. PATENT DOCUMENTS 5,521,453 A * 5/1996 Yatsuda .................. 310/313 R
5,835,990 A   11/1998 Saw et al. .............. 310/313 D
5,874,868 A    2/1999 Shimoe ....................... 333/193
5,986,524 A * 11/1999 Shimoe ....................... 333/195
6,420,946 B1 * 7/2002 Bauer et al. ................ 333/193

FOREIGN PATENT DOCUMENTS

JP         5-267990      10/1993
JP        10-190394       7/1998
WO     WO 00/25423    * 5/2000

* cited by examiner

Primary Examiner—Barbara Summons
(74) Attorney, Agent, or Firm—Keating & Bennett, LLP

(57) ABSTRACT

A longitudinally coupled resonator type surface acoustic wave filter includes a piezoelectric substrate and first, second and third IDTs provided on the piezoelectric substrate and arranged in a surface wave propagating direction such that the second IDT is interposed between the first and the third IDTs. Each of the first, second and third IDTs has a plurality of electrode fingers. The first and second IDTs have narrow electrode-finger pitch sections that have an electrode-finger pitch narrower than the remaining electrode-finger pitches, at respective end portions of the first and second IDTs adjacent to each other. The second and third IDTs have narrow electrode-finger pitch sections that have an electrode-finger pitch narrower than the remaining electrode-finger pitches, at respective end portions of the second and third IDTs adjacent to each other. The electrode-finger pitch of the narrow electrode-finger pitch sections in the first and second IDTs is different from the electrode-finger pitch of the narrow electrode-finger pitch sections in the second and third IDTs.

45 Claims, 25 Drawing Sheets

LONGITUDINALLY COUPLED RESONATOR TYPE SURFACE ACOUSTIC WAVE FILTER HAVING NARROW ELECTRODE FINGER PITCH SECTIONS

BACKGROUND OF THE INVENTION

1. Field of the Invention

The present invention relates to a longitudinally coupled resonator type surface acoustic wave filter, and more particularly, to a longitudinally coupled resonator type surface acoustic wave filter, in which at least three IDTs are arranged in a surface wave propagating direction.

2. Description of the Related Art

Recently, with the increasing numbers of customers and the diversifying services, many more mobile phone systems use transmission-side frequency bands and reception-side frequency bands close to each other. In addition, to prevent interference with other communication systems, there is a demand for increased attenuation very close to a pass band.

As a result, there is a strong demand for obtaining an attenuation band very closely to the pass band in surface acoustic wave filters widely used as band pass filters for an RF stage in a mobile phone.

On the other hand, recently, to reduce the number of components, there has been a growing demand for a balance-unbalance conversion function, the so-called balun function. Thus, as the band pass filter for an RF stage in a mobile phone, longitudinally coupled resonator type surface acoustic wave filters easily adaptable to the balance-unbalance conversion function have been used. Various types of longitudinally coupled resonator type surface acoustic wave filters (for example, Japanese Unexamined Patent Application Publication No. 5-267990, etc.) have been provided.

However, in the longitudinally coupled resonator type surface acoustic wave filter, an undesired response referred to as a transversal response appears on a frequency side higher than a pass band. Thus, for example, it is impossible to obtain large attenuation on the pass band high frequency side, which is required in a mobile phone system of the PCS system.

FIG. 10 shows a schematic plan view illustrating the electrode structure of a longitudinally coupled resonator type surface acoustic wave filter disclosed in Japanese Unexamined Patent Application Publication No. 10-190394. In the longitudinally coupled resonator type surface acoustic wave filter 101, IDTs 102 to 104 are arranged in a surface wave propagating direction. On both sides of the IDTs 102 to 104 reflectors 105 and 106 are provided. In this case, an IDT gap P between the IDTs 102 and 103 is differentiated from an IDT gap Q between the IDTs 103 and 104. With this arrangement, the above transversal response is suppressed. In the conventional longitudinally coupled resonator type surface acoustic wave filter of the 3-IDT type, in addition to a zero-order mode and a second mode, a resonance mode (hereinafter referred to as a resonance mode generated by the IDT to IDT gap) is generated at a peak in the strength distribution of the surface acoustic wave in the gaps between the IDTs. These three resonance modes are used to produce the pass band of the filter.

In the technology described in the conventional art, by differentiating the IDT gap P from the IDT gap Q the resonance mode caused by the IDT to IDT gap is generated in each of the gaps between the IDTs. The two resonance modes are used to produce the pass band. In this technology, attenuation generated near the pass band, particularly, on the high frequency side thereof, is reduced to a greater extent than in the conventional longitudinally coupled resonator type surface acoustic wave filter.

However, the IDT gaps P and Q must be substantially differentiated from 0.50 times the wavelength determined by electrode-finger pitches. As a result, since the propagation continuity of a surface acoustic wave is lost, insertion loss in the pass band is greatly deteriorated.

SUMMARY OF THE INVENTION

To overcome the above-described problems with the prior art, preferred embodiments of the present invention provide a longitudinally coupled resonator type surface acoustic wave filter which eliminates the transversal response, and thereby obtains sufficient attenuation on a pass band high frequency side, and which greatly reduces insertion loss in the pass band.

A longitudinally coupled resonator type surface acoustic wave filter according to preferred embodiments of the present invention includes a piezoelectric substrate and first, second and third IDTs each having a plurality of electrode fingers, provided on the piezoelectric substrate and arranged in a surface wave propagating direction such that the second IDT is interposed between the first and the third IDTs.

The first and second IDTs have narrow electrode-finger pitch sections which have an electrode-finger pitch that is narrower than the remaining electrode-finger pitches, at respective end portions of the first and second IDTs that are adjacent to each other. The second and third IDTs have narrow electrode-finger pitch sections that have an electrode-finger pitch that is narrower than the remaining electrode-finger pitches, at respective end portions of the second and third IDTs, which are adjacent to each other.

According to the first preferred embodiment of the present invention, the electrode-finger pitch of the narrow electrode-finger pitch sections in the first and second IDTs is different from the electrode-finger pitch of the narrow electrode-finger pitch sections in the second and third IDTs.

According to the second preferred embodiment of the present invention, the number of the electrode fingers of the narrow electrode-finger pitch sections in the first and second IDTs is different from the number of the electrode fingers of the narrow electrode-finger pitch sections in the second and third IDTs.

According to the third preferred embodiment of the present invention, only the first and second IDTs or only the second and third IDTs have narrow electrode-finger pitch sections which have an electrode-finger pitch narrower than the remaining electrode-finger pitches, at respective end portions of the first and second IDTs adjacent to each other, or at the respective end portions of the second and third IDTs adjacent to each other.

According to the unique arrangements of these preferred embodiments, transversal response is greatly minimized. In addition, by adjusting the pitches of the narrow electrode-finger pitch sections, without increasing the insertion loss of the pass band, the pass-band width is easily adjusted. It is possible to combine first and second preferred embodiments to further reduce the transversal response.

The first to third preferred embodiments of the present invention are successfully applied to a longitudinally coupled resonator type surface acoustic wave filter including first and second longitudinally coupled resonator type surface acoustic wave filter units. More specifically, the pitches and/or the numbers of electrode fingers of the narrow pitch electrode finger sections are different between the first and second longitudinally coupled resonator type surface acoustic wave filter units. Alternatively, the narrow pitch electrode finger sections may be provided only in either first or second longitudinally coupled resonator type surface acoustic wave filter units. With the above-described configurations, the bandwidth is easily adjusted without degrading the insertion loss.

In the longitudinally coupled resonator type surface acoustic wave filter according to each preferred embodiment of the present invention, when the second IDT has an even number of electrode fingers or when each of the second and fifth IDTs has even numbers of electrode fingers, the difference of the electrode-finger pitches between the narrow electrode-finger pitch sections on both sides of the central IDT can be reduced. Thus, as compared with the case in which the central IDT has odd electrode fingers, the narrowest pitch between the electrode fingers is widened. As a result, the longitudinally coupled resonator type surface acoustic wave filter of each of the first and second preferred embodiments of the present invention are easily produced in a stable manner. Furthermore, as shown in the aforementioned third preferred embodiment, the insertion loss in the pass band is further reduced.

When at least one IDT is subjected to thinning out and weighting, particularly, when the thinning-out and weighting are asymmetrical to the propagating-direction center of the longitudinally coupled resonator type surface acoustic wave filter on both sides of a surface wave propagating direction, the transversal response is more effectively suppressed.

When the longitudinally coupled resonator type surface acoustic wave filter is connected in series and/or in parallel to the surface acoustic wave resonator, attenuation outside a pass band is greatly increased. Furthermore, in this case, when at least one IDT of the longitudinally coupled resonator type surface acoustic wave filter is subjected to weighting, a transversal response is more effectively suppressed. As a result, since the number of the surface acoustic wave resonators is reduced, miniaturization of the element size is achieved.

In the longitudinally coupled resonator type surface acoustic wave filter according to preferred embodiments of the present invention, when a balancing input terminal or a balancing output terminal is provided and an unbalancing output terminal or an unbalancing input terminal is provided, according to preferred embodiments of the present invention, the longitudinally coupled resonator type surface acoustic wave filter has a balancing/unbalancing conversion function and effectively eliminates a transversal response.

Other features, elements, characteristics and advantages of the present invention will become apparent from the following detailed description of preferred embodiments of the present invention with reference to the attached drawings.

DETAILED DESCRIPTION OF PREFERRED EMBODIMENTS

Hereinafter, preferred embodiments of the present invention are explained in detail with reference to the drawings.

Figure 1:
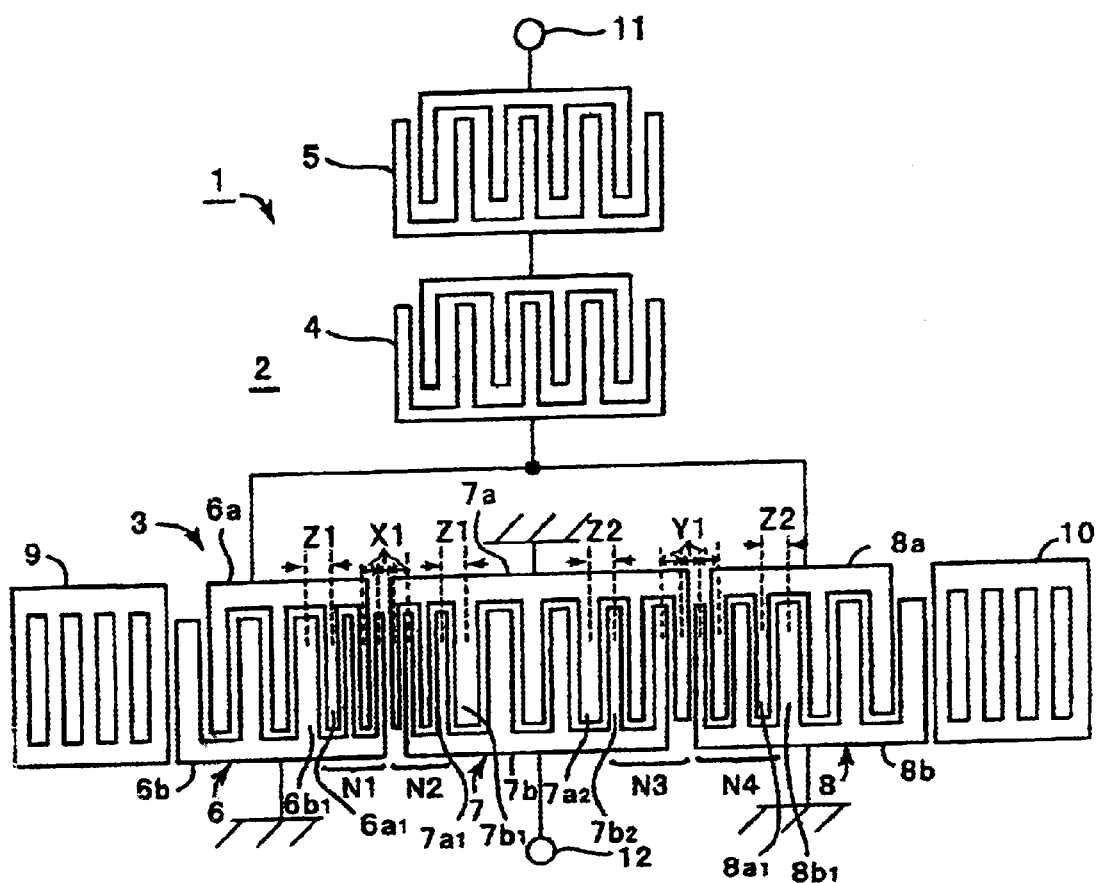
FIG. 1 shows a schematic plan view of a longitudinally coupled resonator type surface acoustic wave filter according to a first preferred embodiment of the present invention.

FIG. 1 shows a schematic plan view illustrating the electrode structure of a longitudinally coupled resonator type surface acoustic wave filter according to a first preferred embodiment of the present invention.

A longitudinally coupled resonator type surface acoustic wave filter 1 of the present preferred embodiment is preferably used as a band pass filter for the Rx of the PCS system.

In this preferred embodiment, an electrode structure, which is shown in FIG. 1, is preferably made of Al on a piezoelectric substrate 2. The piezoelectric substrate 2 used in this preferred embodiment preferably includes a 40±5° Y-cut X-propagation LiTaO$_3$ substrate.

On the piezoelectric substrate 2, a longitudinally coupled resonator type surface acoustic wave filter unit 3 is provided and surface acoustic wave resonators 4 and 5 are connected to the longitudinally coupled resonator type surface acoustic wave filter unit 3.

The longitudinally coupled resonator type surface acoustic wave filter unit 3 preferably includes first to third IDTs 6 to 8 arranged in a surface wave propagating direction. The IDTs 6 to 8 have pairs of comb-shaped electrodes 6a and 6b, 7a and 7b, and 8a and 8b arranged such that the electrode fingers interdigitate with each other.

Reflectors 9 and 10 are arranged on each side of the IDTs 6 to 8 arranged in the surface wave propagating direction. The reflectors 9 and 10 are preferably grating reflectors defined by short-circuiting both ends of the plurality of electrode fingers.

In the area where the IDTs 6 and 7 are adjacent to each other, the electrode-finger pitch of a portion from an end portion close to the counterpart of each of the IDTs 6 and 7 is different from the electrode-finger pitches of the remaining portions. In other words, take, for example, the IDT 6. In the surface wave propagating direction from the end portion of the IDT 6 facing the IDT 7, some portion extending in a direction away from the end portion, that is, an electrode-finger pitch X1 of a narrow electrode-finger pitch section N1 is smaller than the electrode-finger pitches of the remaining portions. Similarly, in the IDT 7, the electrode-finger pitch of a narrow electrode-finger pitch section N2 as some portion from the end portion of the IDT 7 facing the IDT 6 is set to be X1, which is smaller than the electrode-finger pitches of the remaining portions.

On the other hand, the IDT 7 includes the narrow electrode-finger pitch section N2 and a narrow electrode-finger pitch section N3, which will be described below. The electrode-finger pitches between the remaining electrode fingers are greater than the electrode-finger pitches of the narrow electrode-finger pitch sections N2 and N3. However, in the IDT 7, the electrode-finger pitches of the remaining narrow electrode-finger pitch sections are not equal.

In the area where the IDTs are adjacent to each other, the pitch of the narrow electrode-finger pitch section of each of the IDTs 6 and 7 is evenly set to be X1 as mentioned above. In addition, the pitch between the adjacent electrode fingers of the IDTs 6 and 7 is also set to be X1.

Similarly, in the place where the IDTs 7 and 8 are adjacent, narrow electrode-finger pitch sections N3 and N4 are disposed in the IDTs 7 and 8. That is, the electrode-finger pitch of a narrow pitch electrode-finger section N3 of a portion from the end portion of the IDT 7 facing the IDT 8 is set to be Y1, which is smaller than the electrode-finger pitches of the remaining portions. In the IDT 8, also, the electrode-finger pitch of a narrow pitch electrode finger N4 of a portion from the end portion of the IDT 8 facing the IDT 7 is set to be Y1, which is smaller than the electrode-finger pitches of the remaining portions. In addition, the pitch between the adjacent electrode fingers of the IDTs 7 and 8 is also set to be Y1.

In the IDTs 6 to 8, the electrode-finger pitches between the electrode fingers, except the narrow electrode-finger pitch sections N1 to N4, are preferably substantially equal. In addition, the electrode-finger pitch between the narrow electrode-finger pitch sections and the remaining electrode-finger sections is determined as described in the details of an experimental example, which will be explained below. The pitches X1 of the narrow electrode-finger pitch sections provided where the IDTs 6 and 7 are adjacent to each other are different from the pitches Y1 of the narrow electrode-finger pitch sections provided where the IDTs 7 and 8 are adjacent to each other. In this preferred embodiment, X1 is smaller than Y1.

In FIG. 1, for better understanding, the number of electrode fingers is shown to be less than the actual number of electrode fingers.

The comb-shaped electrodes 6a and 8a of the IDTs 6 and 8 are connected to an input terminal 11 via the surface acoustic wave resonators 4 and 5. The surface acoustic wave resonators 4 and 5 are one-terminal pair surface acoustic wave resonators connected in series between the comb-shaped electrodes 6a and 8a and the input terminal 11. Each of the comb-shaped electrodes 6b and 8b are connected to a ground potential. In addition, the comb-shaped electrode 7a is connected to a ground potential. On the other hand, the comb-shaped electrode 7b is electrically connected to an output terminal 12.

A description will be given of the detailed structure and characteristics of the longitudinally coupled resonator type surface acoustic wave filter 1 of the first preferred embodiment.

The wavelength of a surface acoustic wave determined by the pitches X1 of the narrow electrode-finger pitch sections at which the IDTs 6 and 7 are adjacent is set to be $\lambda I2$ and the wavelength of a surface acoustic wave determined by the pitches Y1 of the narrow electrode-finger pitch sections at which the IDTs 7 and 8 are adjacent is set to be $\lambda I3$. The wavelength of the surface acoustic wave determined by the pitches between the remaining electrode fingers is set to be $\lambda I1$. The IDTs 6 to 8 are provided as follows.

That is, the electrode-finger cross width is preferably substantially equal to $69.0\lambda I1$.

The number of the electrode fingers of the IDT 6: the number of the electrode fingers of the narrow electrode-finger pitch section is 4 and the number of the electrode fingers of the remaining electrode finger section is 21.

IDT 7 is configured such that the number of the electrode fingers of the narrow electrode-finger pitch section facing the IDT 6 is 4; the number of the electrode fingers of the narrow electrode-finger pitch section facing the IDT 8 is 4; and the number of the electrode fingers of the remaining electrode finger section is 27.

IDT 8 is configured such that the number of the electrode fingers of the narrow electrode-finger pitch section is 4, and the number of the electrode fingers of the remaining electrode finger section is 21.

$\lambda I1$ is equal to about 2.03 $\mu$mm; $\lambda I2$ is equal to about 1.62 $\mu$m; and $\lambda I3$ is equal to about 1.98 $\mu$m.

The wavelength $\lambda R$ of each of the reflectors 9 and 10 is about 2.05 $\mu$m and the number of the electrode fingers of each of the reflectors 9 and 10 is 100.

The distance of the portion indicated by arrows Z1 (distance between the electrode-finger centers) shown in FIG. 1, that is, the distance between an electrode finger $6b_1$ of the wavelength $\lambda I1$ and an electrode finger $6a_1$ of the wavelength $\lambda I2$ is equal to about 0.25 $\lambda I1$+0.25 $\lambda I2$.

The distance between an electrode finger $7b_1$ of the wavelength $\lambda I1$ and an electrode finger $7a_1$ of the wavelength $\lambda I2$ is equal to about 0.25 $\lambda I1$+0.25 $\lambda I2$.

The distance indicated by arrows Z2 shown in FIG. 1, that is, the distance between an electrode finger $8a_1$ of the wavelength $\lambda I3$ and an electrode finger $8b_1$ of the wavelength $\lambda I1$ is equal to about 0.25 $\lambda I1$+0.25 $\lambda I3$.

The distance between an electrode finger $7b_2$ of the wavelength $\lambda I3$ and an electrode finger $7a_2$ of the wavelength $\lambda I1$ is also equal to about 0.25 $\lambda I1$+0.25 $\lambda I3$.

The distance X1 between the electrode-finger centers of the adjacent IDTs 6 and 7 is equal to about 0.50 $\lambda I2$.

The distance Y1 between the electrode-finger centers of the adjacent IDTs 7 and 8 is equal to about 0.50 $\lambda I3$.

The distance between the IDT 6 and the reflector 9 and the distance between the IDT 8 and the reflector 10 are equal to 0.55 $\lambda R$ as the distance between the electrode-finger centers.

Duty in each of the IDTs 6 to 8, that is, the size of the electrode-finger widthwise direction/(electrode-finger widthwise direction+the widthwise-direction size of a gap between the adjacent electrode fingers) is equal to about 0.60.

Duty in each reflector is equal to about 0.60.

The film thickness of each of the IDTs 6 to 8 and the reflectors 9 and 10 are equal to about 0.08 $\lambda I1$.

In addition, the surface acoustic wave resonators 4 and 5 are provided as presented in the following Table 1.

TABLE 1

| | SURFACE ACOUSTIC WAVE RESONATOR 4 | SURFACE ACOUSTIC WAVE RESONATOR 5 |
|---|---|---|
| CROSS WIDTH | 34.7 $\lambda$ | 20.2 $\lambda$ |
| NUMBER OF IDT | 301 | 201 |
| WAVELENGTH $\lambda$ (IDT AND REFLECTOR) | 2.02 $\mu$m | 1.98 $\mu$m |
| IDT-REFLECTOR DISTANCE | 0.50 $\lambda$ | 0.50 $\lambda$ |
| NUMBER OF REFLECTOR | 30 | 30 |
| DUTY (IDT AND REFLECTOR) | 0.60 | 0.60 |
| ELECTRODE FILM THICKNESS | 0.080 $\lambda$ | 0.082 $\lambda$ |

Figure 3:
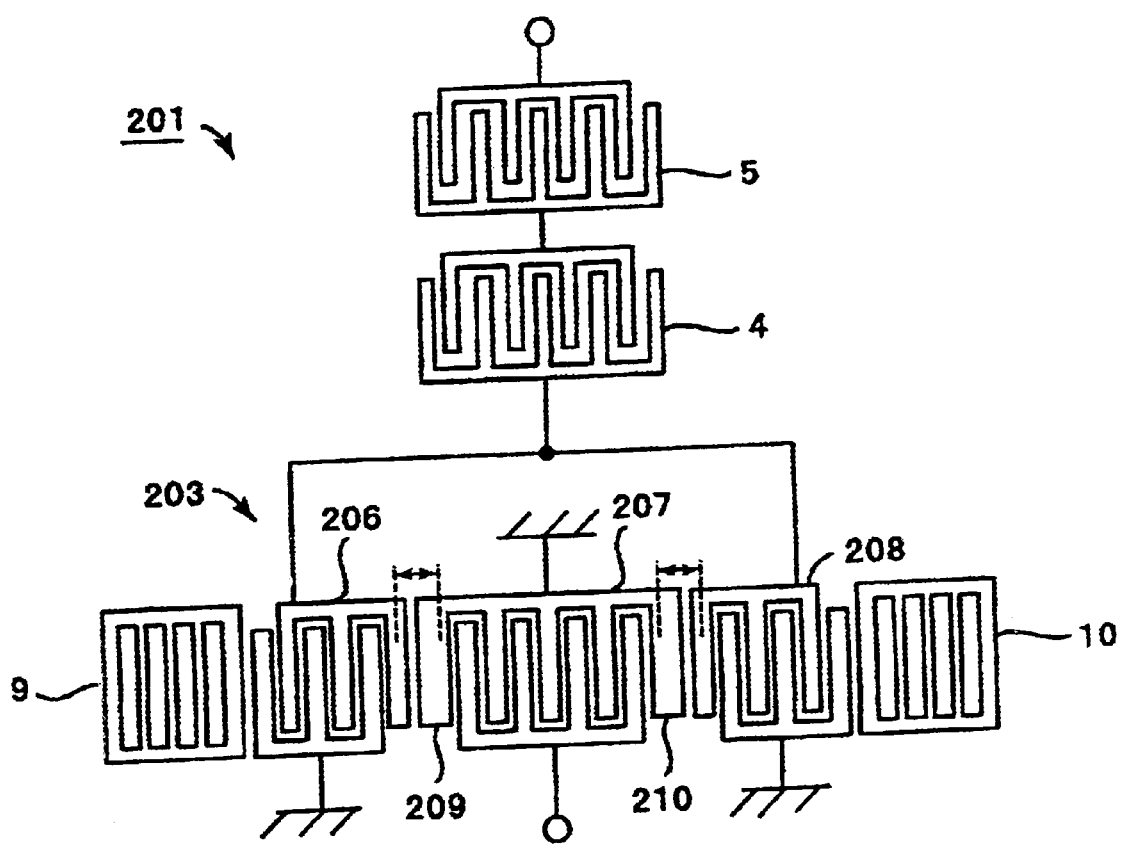
FIG. 3 shows a schematic plan view illustrating the electrode structure of the conventional longitudinally coupled resonator type surface acoustic wave filter prepared for comparison.

For comparison, a conventional longitudinally coupled resonator surface acoustic wave filter 201 shown in FIG. 3 was produced. In the conventional longitudinally coupled resonator surface acoustic wave filter, the following points (1) to (4) are different from the structure of the longitudinally coupled resonator surface acoustic wave filter according to the present preferred embodiment of the present invention.

(1) The electrode-finger cross width is 69.0 $\lambda I$ ($\lambda I$=$\lambda I1$, that is, a narrow pitch electronic portion is not provided.)

(2) The number of the electrode fingers of the central IDT 207 is 41 and the number of the electrode fingers of each of IDTs 206 and 208 on both sides of a surface wave propagating direction is 26.

(3) The distance between the adjacent IDTs is 0.77 $\lambda I$, that is, the distance between the adjacent electrode-finger centers.

(4) When the distance between the IDTs is 0.77 $\lambda I$, electrodeless portions increase in the gap between the IDTs. Thus, as shown in FIG. 3, the widths of IDTs 209 and 210 on both sides of the IDT 207 were increased.

The remaining portions are the same as those of the longitudinally coupled resonator type surface acoustic wave filter 1 of the first preferred embodiment of the present invention.

Figure 2:
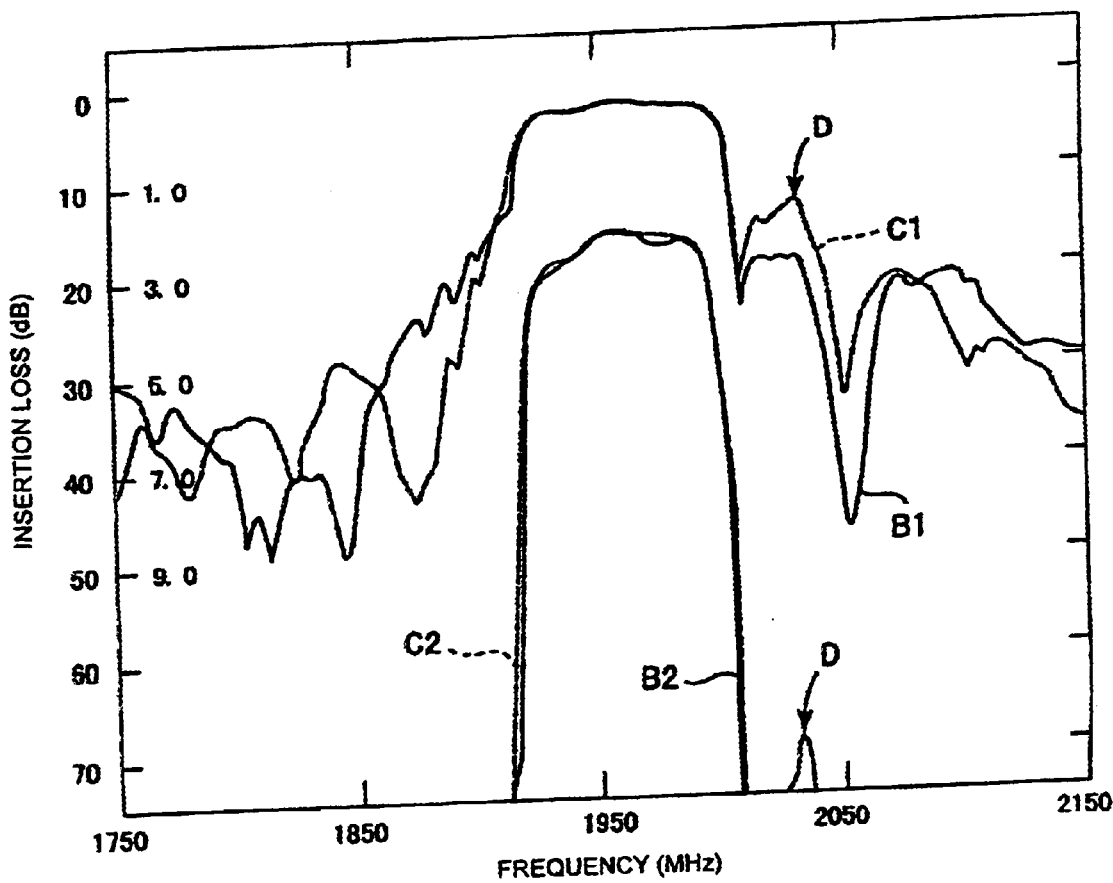
FIG. 2 shows a graph illustrating the frequency characteristics of the longitudinally coupled resonator type surface acoustic wave filter of the first preferred embodiment and a conventional example prepared for comparison.

FIG. 2 shows the frequency characteristics of both longitudinally coupled resonator type surface acoustic wave filters of the preferred embodiment and the conventional longitudinally coupled resonator type surface acoustic wave filter obtained in the above manner.

In FIG. 2, solid lines B1 and B2 indicate the results of the first preferred embodiment and broken lines C1 and C2 indicate the results of the conventional prior art. The solid line B2 and the broken line C2 indicate characteristics with the vertical-axis right scale.

As evident in FIG. 2, in the conventional longitudinally coupled resonator surface acoustic wave filter 201, there is a large transversal response indicated by an arrow D on a pass-band high frequency side. However, in the longitudinally coupled resonator surface acoustic wave filter of the first preferred embodiment, the transversal response is approximately 5 dB lower than that of the conventional prior art. Furthermore, in the first preferred embodiment, the steepness of filter characteristics on the pass-band low frequency side is greatly increased. In addition, insertion loss in the pass band and the pass-band width of the attenuation of 4 dB from a through-level in the preferred embodiment are similar those in the conventional longitudinally coupled resonator surface acoustic wave filter.

Therefore, in the first preferred embodiment, the transversal response is greatly minimized and the steepness of the filter characteristics near the pass band is greatly increased.

A description will now be given of the principle of the longitudinally coupled resonator type surface acoustic wave filter of the first preferred embodiment.

Figure 4:
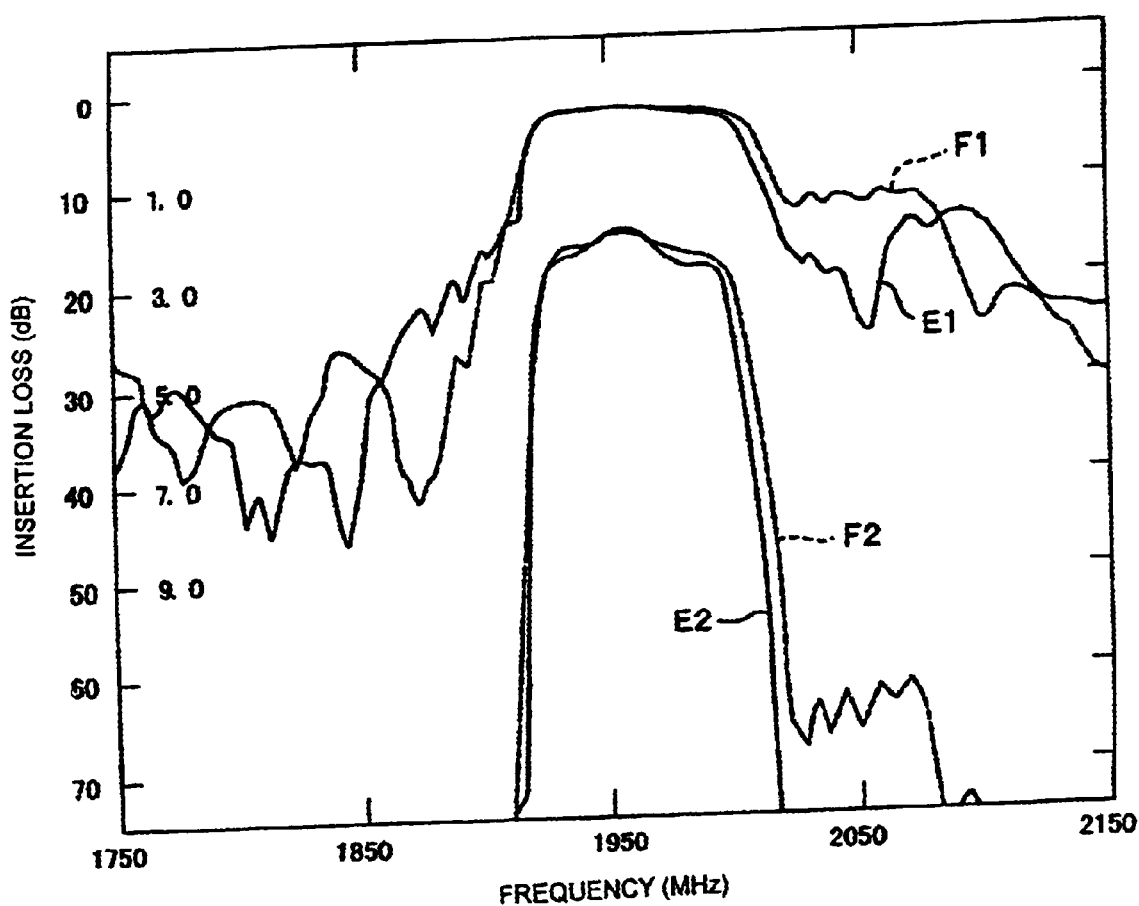
FIG. 4 shows a graph illustrating the frequency characteristics of longitudinally coupled resonator type surface acoustic wave filter units of both the first preferred embodiment and the conventional example prepared for comparison.

FIG. 4 shows the frequency characteristics of the longitudinally coupled resonator type surface acoustic wave filter unit 3 of the first preferred embodiment and the frequency characteristics of the longitudinally coupled resonator type surface acoustic wave filter unit 203 disconnected from the surface acoustic wave resonators 4 and 5 in the conventional longitudinally coupled resonator type surface acoustic wave filter 201 of the preferred embodiment. Solid lines E1 and E2 indicate the frequency characteristics of the first preferred embodiment and solid lines F1 and F2 indicate the frequency characteristics of the conventional prior art. The solid line E2 and the broken line F2 indicate characteristics obtained by enlarging the characteristics indicated by the solid line E1 and the broken line F1 with the vertical-axis right scale.

As shown in FIG. 4, in the longitudinally coupled resonator type surface acoustic wave filter unit 3 used in the first preferred embodiment, the transversal response on the pass-band high frequency side is suppressed to a much greater extent than in the conventional art.

Figure 5A:
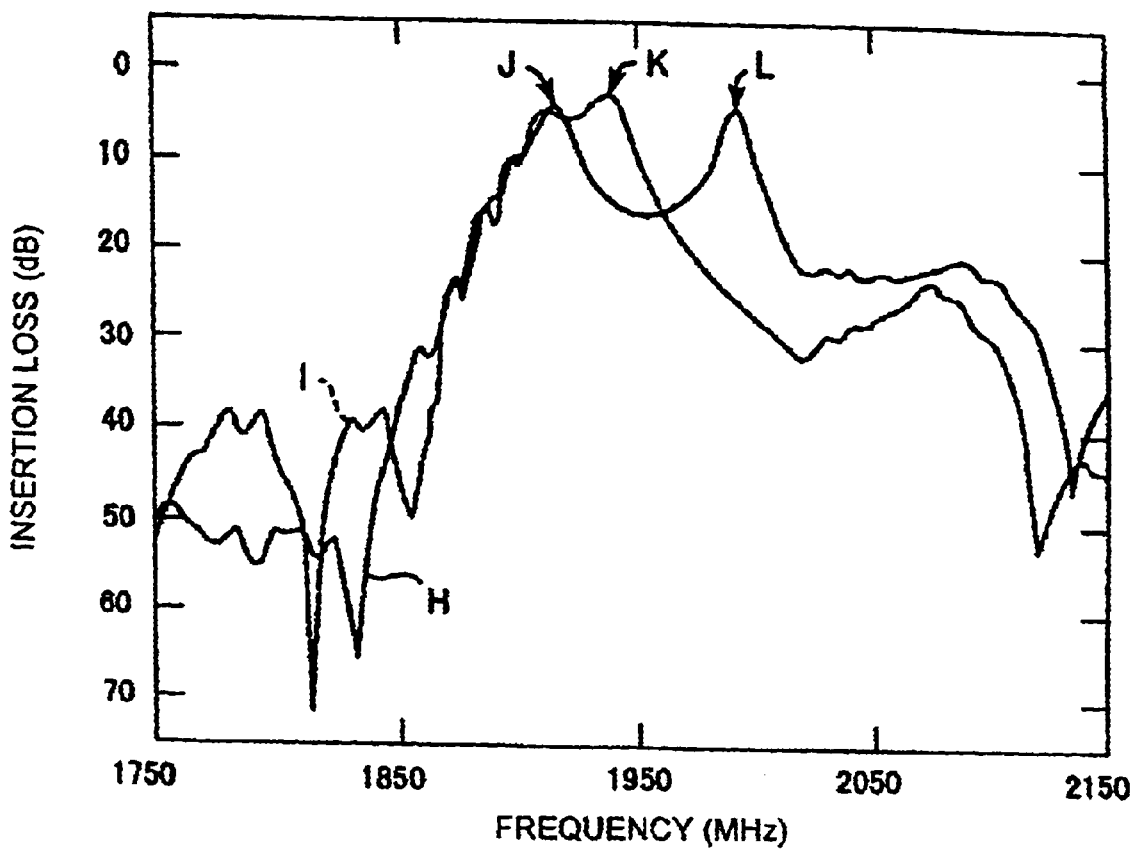
FIG. 5A and FIG. 5B show graphs for illustrating the principle of the longitudinally coupled resonator type surface acoustic wave filter of the first preferred embodiment, FIG. 5A showing the positions of resonance modes and FIG. 5B showing phase characteristics.
Figure 5B:
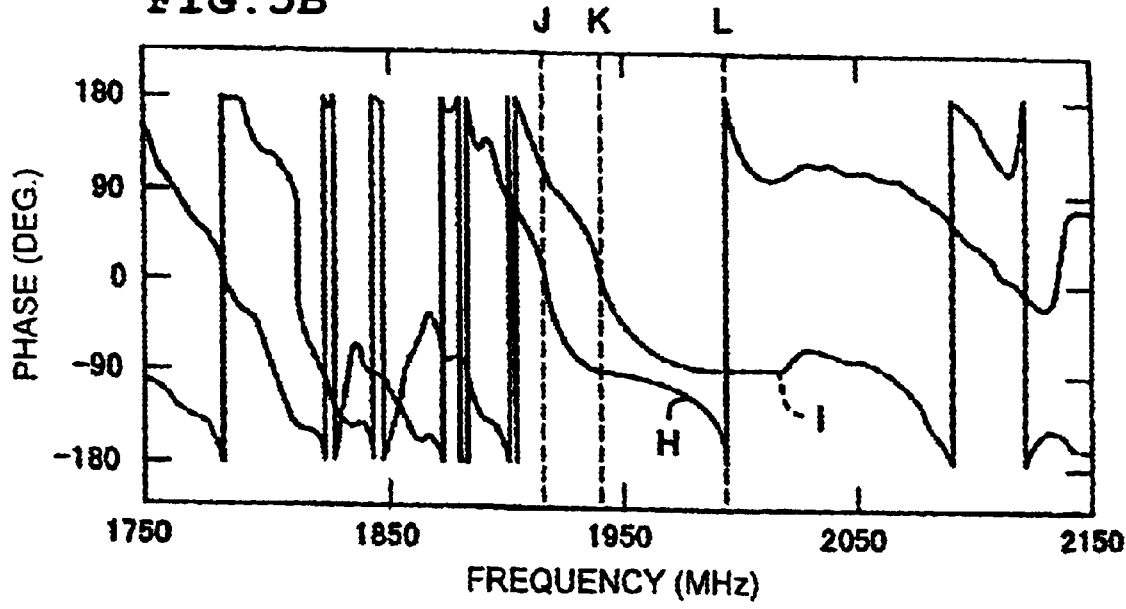

FIG. 5A shows the positions of the resonance modes of a filter (hereinafter referred to as filter 1), in which the electrode-finger pitch X1 is equal to Y1 and the pitches of the narrow pitch electrode fingers are preferably all about 1.62 μm in the structure shown in FIG. 1 and the resonance modes of a filter (hereinafter referred to as filter 2), in which the pitches X1 and Y1 of the narrow pitch electrode fingers are preferably all about 1.98 μm. FIG. 5B shows phase characteristics. In FIGS. 5A and 5B, a solid line H indicates the result of the filter 1 and a broken line I indicates the result of the filter 2.

Figure 6:
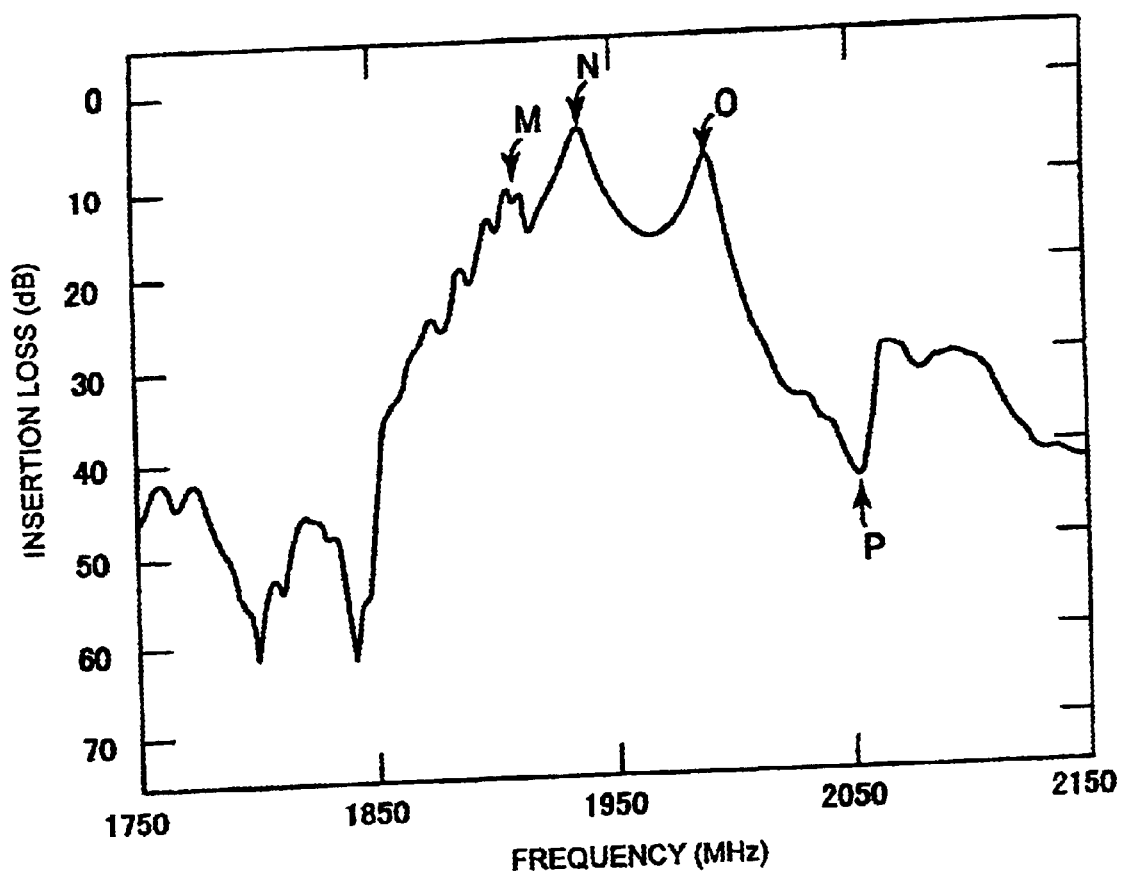
FIG. 6 shows a graph for illustrating the positions of resonance modes obtained when two pieces of the longitudinally coupled resonator type surface acoustic wave filter units are connected in parallel to each other in the longitudinally coupled resonator type surface acoustic wave filter according to the first preferred embodiment.

In addition, FIG. 6 shows the resonance modes when the filters 1 and 2 are connected in parallel with each other.

FIGS. 5 and 6 show characteristics intentionally deviated greatly from impedance matching conditions to check the resonance modes.

As shown in FIGS. 5 and 6, in both of the filters 1 and 2, two resonance modes are present. That is, in the filter 1, resonance modes J and L are shown, and in the filter 2, resonance modes J and K are shown. In the conventional longitudinally coupled resonator type surface acoustic wave filter, with the use of the two resonance modes, filter characteristics are obtained.

Of the two resonance modes, the frequency of the resonance mode J is approximately the same in the filters 1 and 2. In this case, the phases of the resonance modes J are shifted by approximately 120° between the filters 1 and 2. Consequently, as shown by arrow M in FIG. 6, the amplitude level of the resonance mode is reduced.

When it is desirable to reduce the amplitude level of the resonance mode J, the phase difference between the filters 1 and 2 must be close to approximately 180°.

On the other hand, the phases of the remaining resonance modes K and L of the filters 1 and 2 are shifted by 180°. Thus, by arranging the two resonance modes at an appropriate frequency distance to permit an acoustic coupling therebetween, filter characteristics are obtained. In this situation, the pass-band width of each of the filters is determined by the frequency difference between the two resonance modes K and L. The frequency of each of the resonance modes K and L changes by altering the pitch between the narrow pitch electrode fingers.

That is, by changing the electrode-finger pitch of the narrow electrode-finger pitch section in each of the filters 1 and 2, an arbitrary pass-band width is produced in the range where the two resonance modes perform the acoustic coupling.

In addition, the phases of the transversal response portions are shifted by approximately 180° between the filters 1 and 2. As a result, the neighboring-portion amplitude level is reduced (arrow P shown in FIG. 6). Therefore, as mentioned above, the transversal response is further suppressed in this preferred embodiment than in the conventional longitudinally coupled resonator type surface acoustic wave filter.

Figure 10:
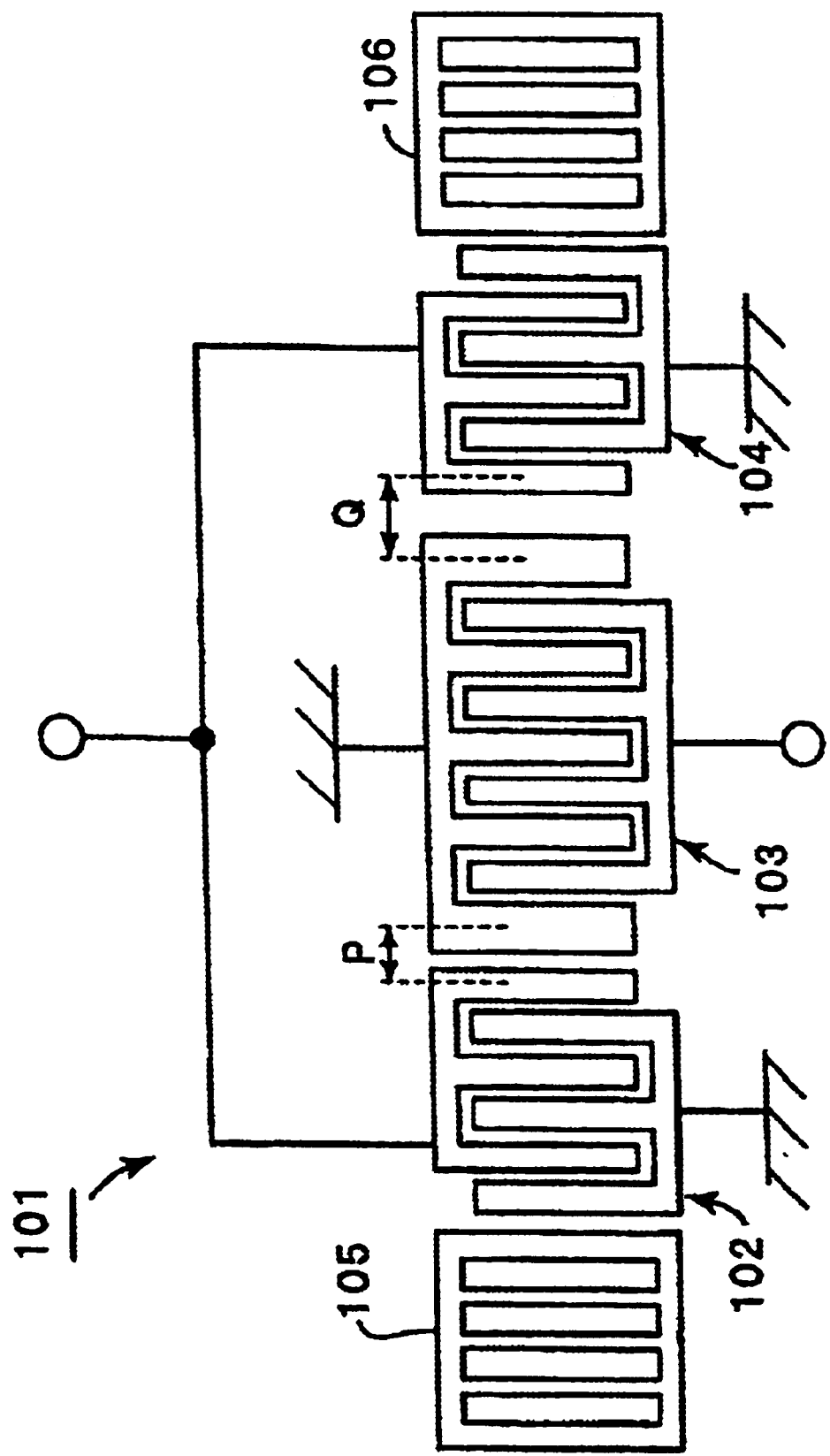
FIG. 10 shows a schematic plan view for illustrating the electrode structure of a conventional longitudinally coupled resonator type surface acoustic wave filter.

Such results are also obtained by altering the gaps between IDTs (IDT gaps P and Q shown in FIG. 10) in a longitudinally coupled resonator type surface acoustic wave filter 101 shown in FIG. 10. However, in this method, it is necessary to greatly alter the gaps between the IDTs by over 0.50 times the wavelength determined by the electrode-finger pitch. As a result, the propagation continuity of the surface acoustic wave is lost, thereby increasing the insertion loss in the pass band.

In contrast, in this preferred embodiment, the gap between IDTs is preferably set at a value obtained by adding the value of approximately 0.25 times the wavelength determined by the pitch between the adjacent electrode-fingers. Thus, the propagation continuity of the surface acoustic wave is not substantially lost. As a result, the insertion loss in the pass band does not increase.

The following Table 2 presents the minimum insertion losses in the pass band and levels at which the pass-band width is at least 75 MHz obtained in the above preferred embodiment and a PCS-Rx filter equivalent to the preferred embodiment shown in FIG. 1 designed by the method shown in FIG. 10.

TABLE 2

|  | CONVENTIONAL ART | PRESENT INVENTION |
|---|---|---|
| MINIMUM INSERTION LOSS | 2.8 dB | 2.1 dB |
| LEVEL OF PASS BAND WIDTH 75 MHz | 4.5 dB | 3.9 dB |

As shown in Table 2, insertion loss within a pass band is reduced to a much greater extent in preferred embodiments of the present invention than the method described in the conventional prior art.

As mentioned above, in the longitudinally coupled resonator type surface acoustic wave filter of the preferred embodiment, the pass-band width can be arbitrarily set and, moreover, the transversal response is effectively suppressed.

Figure 26:
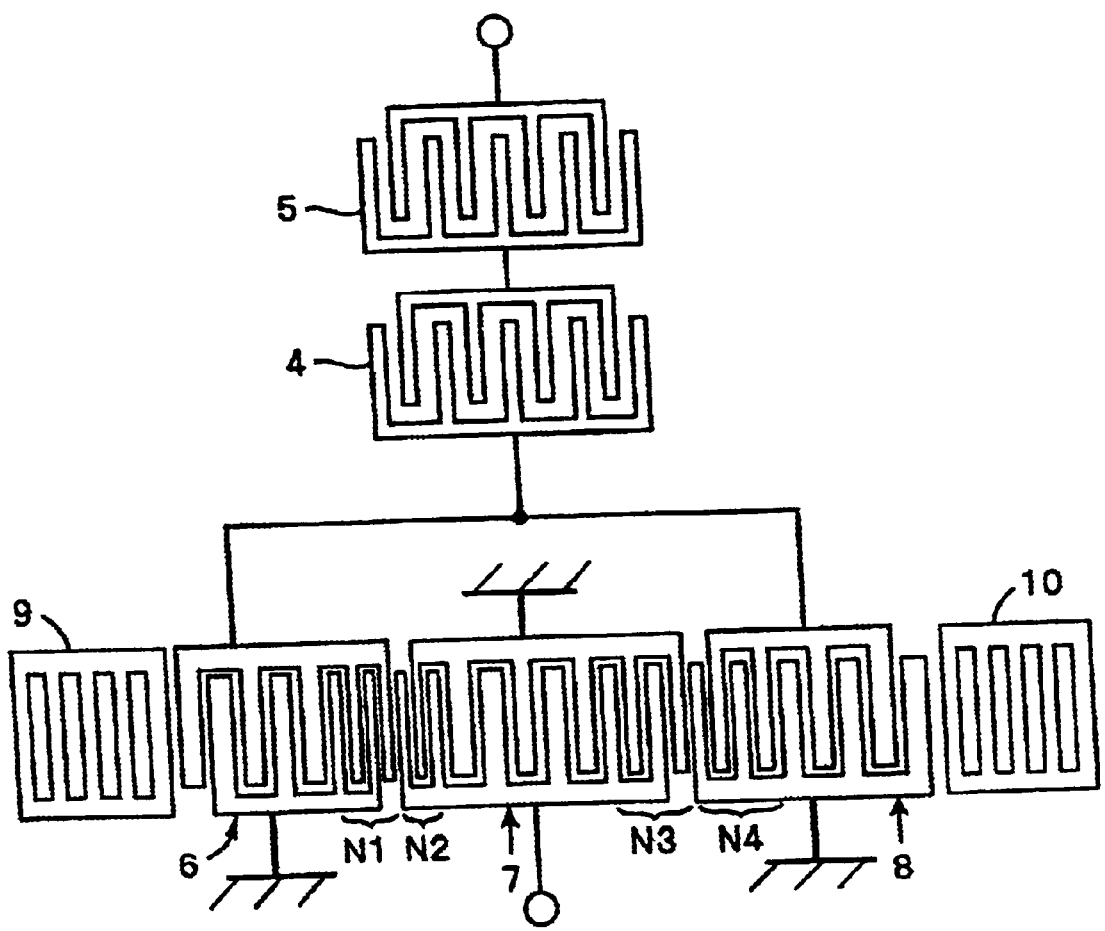
FIG. 26 shows a schematic plan view of a longitudinally coupled resonator type surface acoustic wave filter according to a modified example of the first preferred embodiment.

Although the number of the narrow pitch electrode fingers at the portions where the IDTs 6 and 7 are adjacent to each other is identical to the number of the narrow pitch electrode fingers at the portions where the IDTs 6 and 7 are adjacent to each other, the same effect is obtained by providing different numbers of narrow pitch electrode fingers. FIG. 26 shows the structure in which the number of the narrow pitch electrode fingers of the IDT 7 on the side adjacent to the IDT 6 is reduced by one. The structure shown in FIG. 26 is identical to the structure shown in FIG. 1 except that the wavelength of the narrow pitch electrode finger portions N1 and N2 is approximately $1.57\lambda$ in addition to the above-explained number.

Figure 27:
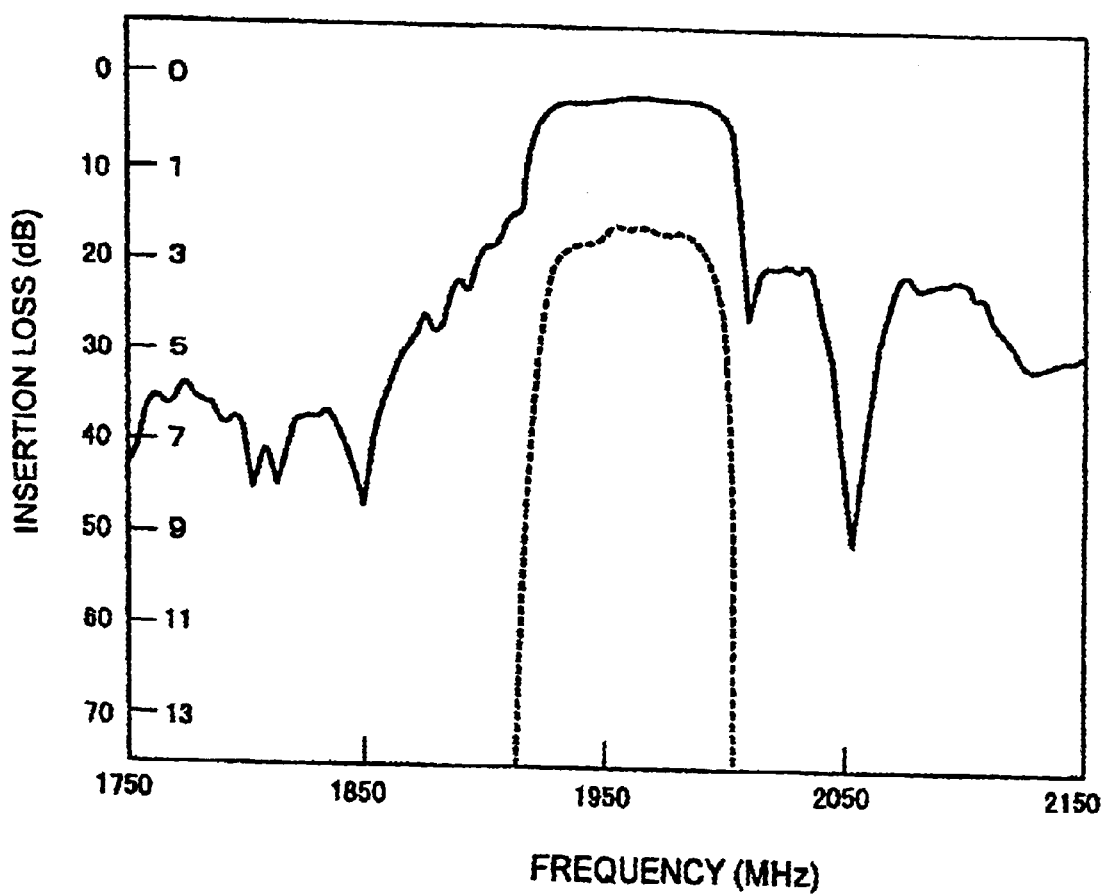
FIG. 27 shows a graph of the frequency characteristics of a longitudinally coupled resonator type surface acoustic wave filter according to a modified example of the first preferred embodiment shown in FIG. 26.

FIG. 27 shows frequency characteristics of the longitudinally coupled resonator type surface acoustic wave filter shown in FIG. 26. As is apparent from FIG. 27, the transversal response on the high frequency side of the passband is minimized in the same manner as the longitudinally coupled resonator type surface acoustic wave filter shown in FIG. 1. Thus, the transversal response on the high frequency side of the passband is greatly improved by making the numbers of narrow pitch electrode fingers different at the portions where the right IDT and the center IDT are adjacent to each other and where the center IDT and the left IDT are adjacent with each other.

Although FIG. 26 shows a preferred embodiment in which the pitch of the narrow pitch electrode finger portions where the IDTs 6 and 7 are adjacent to each other and the pitch of the narrow pitch electrode finger portions where the IDTs 7 and 8 are adjacent to each other are different, the transversal response on the high frequency side of the passband is greatly improved only by making the numbers of the narrow pitch electrode finger portions of these portions different.

Although in the above-explained preferred embodiment, the narrow pitch electrode finger portions are provided at both regions where the IDTs and 6 and 7 are adjacent to each other and where the IDTs and 7 and 8 are adjacent to each other, the narrow pitch electrode finger portions may be provided at only one side thereof.

Figure 28:
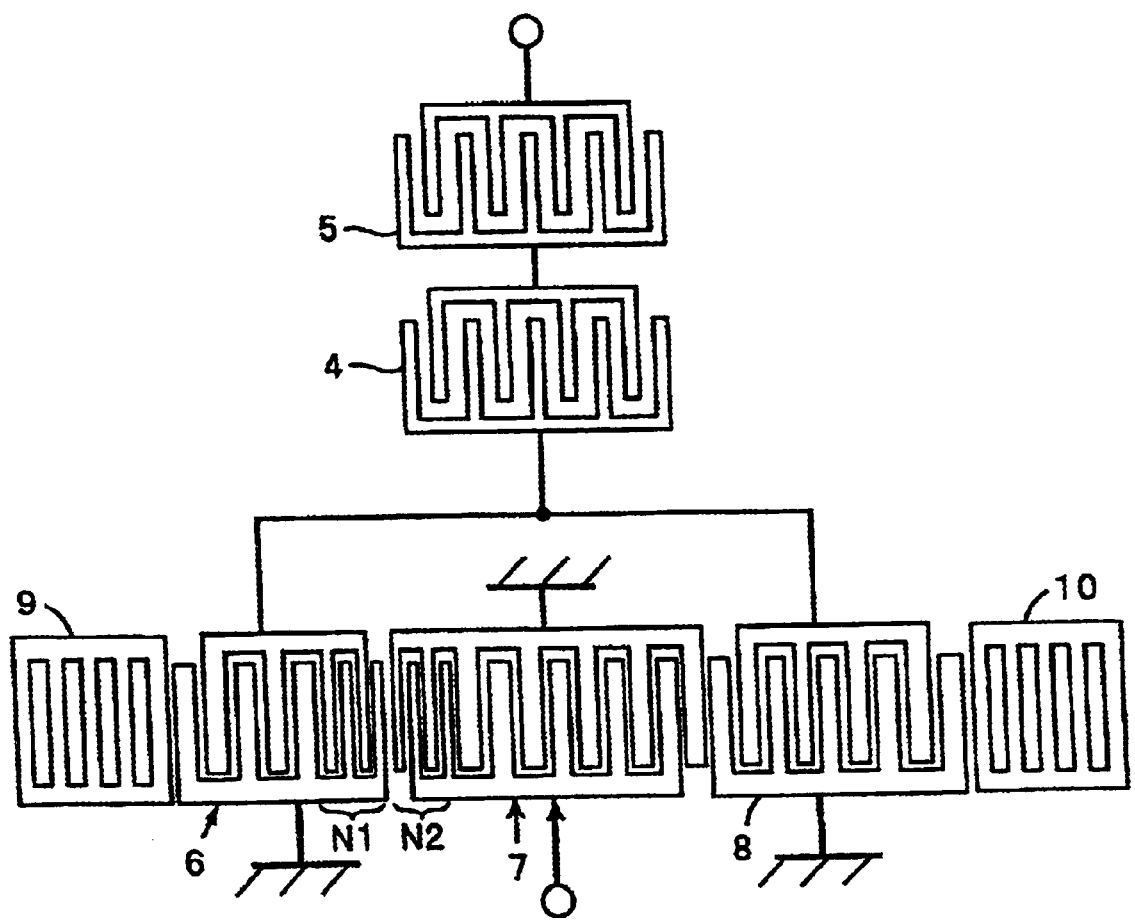
FIG. 28 shows a schematic plan view of a longitudinally coupled resonator type surface acoustic wave filter according to another modified example of the first preferred embodiment.

FIG. 28 shows the preferred embodiment in which the IDTs 7 and 8 have no narrow pitch electrode fingers portions, and the narrow pitch electrode finger portions are provided at the region where the IDTs 6 and 7 are adjacent to each other. The preferred embodiment shown in FIG. 28 is identical to the preferred embodiment shown in FIG. 1 except that the electrode center distance X1 between the IDTs 6 and 7 is about $0.42\lambda I2$ and the electrode center distance Y1 between the IDTs 7 and 8 is about $0.50\lambda I2$ in addition to the feature regarding the narrow pitch electrode fingers portions. The continuity of electrode finger in a surface acoustic wave device is not impaired.

Figure 29:
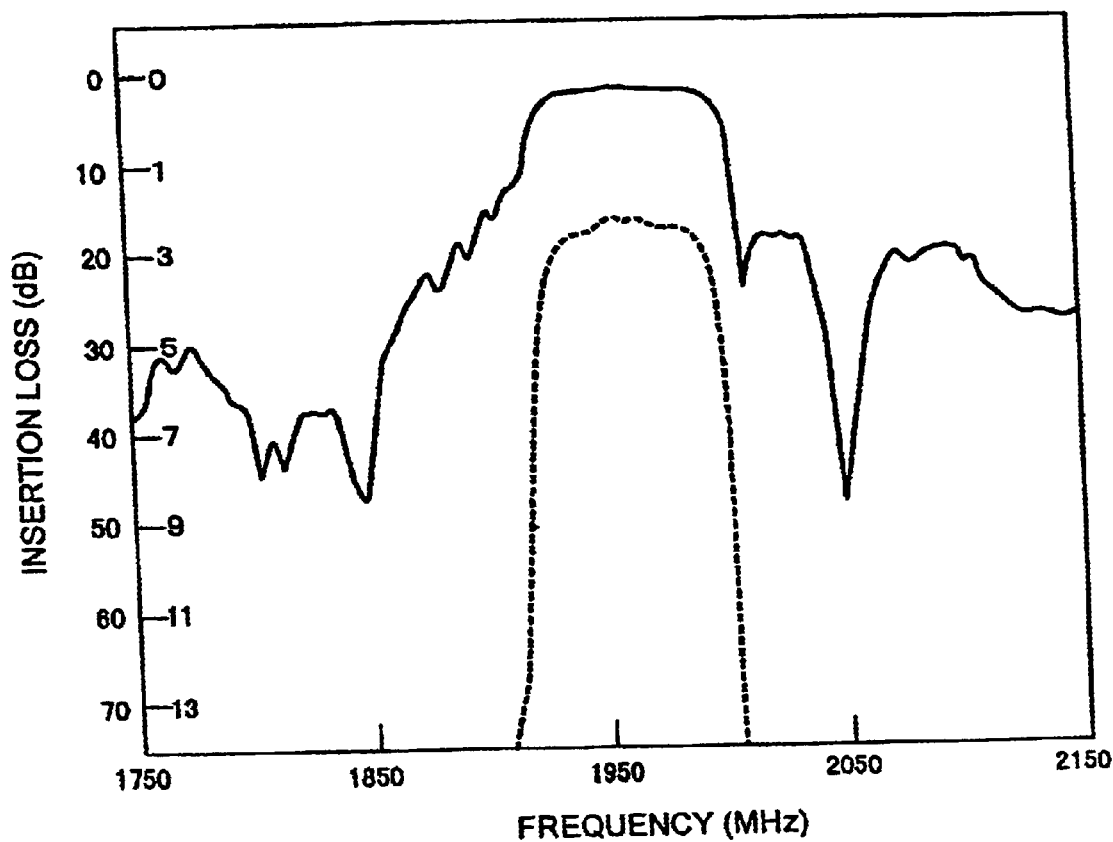
FIG. 29 shows a graph of the frequency characteristics of a longitudinally coupled resonator type surface acoustic wave filter according to another modified example of the first preferred embodiment shown in FIG. 26.

FIG. 29 shows frequency characteristics of a longitudinally coupled resonator type surface acoustic wave filter shown in FIG. 28. It is understood from FIG. 29 that the transversal response on the high frequency side of the passband is suppressed in the same manner as the longitudinally coupled resonator type surface acoustic wave filter shown in FIG. 1. In this way, the transversal response on the high frequency side of the passband is greatly improved by providing narrow pitch electrode finger portions at either the portion where the right IDT and the center IDT are adjacent to each other or the portion where the center IDT and the left IDT are adjacent to each other. Further, the same effect is obtained where the pitch of either the portion where the IDTs 6 and 7 are adjacent to each other or the portion where the IDTs 7 and 8 are adjacent to each other is made greater than the remaining pitches.

In the above-described preferred embodiment, as the piezoelectric substrate 2, a 40±5° Y-cut X-propagation LiTaO$_3$ substrate is preferably used. However, the piezoelectric substrate of the present invention is not limited to the above material. For example, as the piezoelectric substrate, a piezoelectric substrate made of another piezoelectric single crystal, such as a 64 to 72° Y-cut X-propagation LiNbO$_3$ substrate, a 41° Y-cut X-propagation LiNbO$_3$ substrate may be used.

Figure 7:
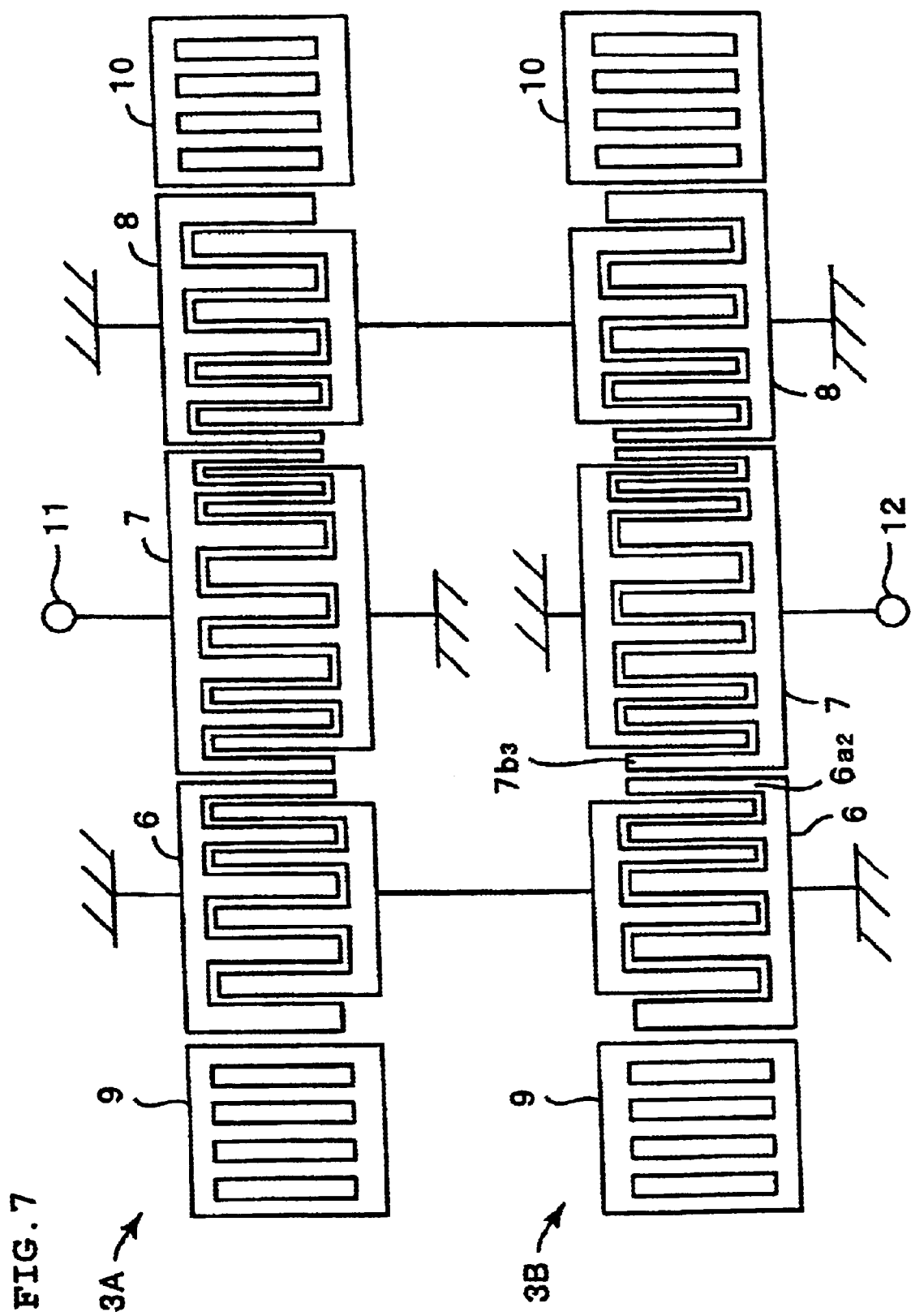
FIG. 7 shows a schematic plan view for illustrating a longitudinally coupled resonator type surface acoustic wave filter according to a modified example of the first preferred embodiment.

In addition, in the above-described preferred embodiment, the surface acoustic wave resonators 4 and 5 are connected in series to the longitudinally coupled resonator type surface acoustic wave filter unit 3. However, the surface acoustic wave resonators may be connected in parallel to the longitudinally coupled resonator type surface acoustic wave filter unit 3, and additionally, the surface acoustic wave resonators 4 and 5 may be connected both in series and in parallel. Furthermore, as shown in FIG. 7, longitudinally coupled resonator type surface acoustic wave filter units 3A and 3B, which are similar to the longitudinally coupled resonator type surface acoustic wave filter unit 3 may be connected in series. When such two-stage longitudinally coupled resonator type surface acoustic wave filter units are connected in series, the electrode-finger cross widths may be different between the stages such that there is a difference in the design between the two longitudinally coupled resonator type surface acoustic wave filter units 3A and 3B.

In addition, as shown in FIG. 7, the closest electrode fingers of the adjacent IDTs, for example, the polarities of an electrode finger $6a_2$ and an electrode finger $7b_3$ may be different to define a signal electrode and a ground electrode. With this arrangement, the same advantages as those in the above-described preferred embodiments are obtained.

Figure 8:
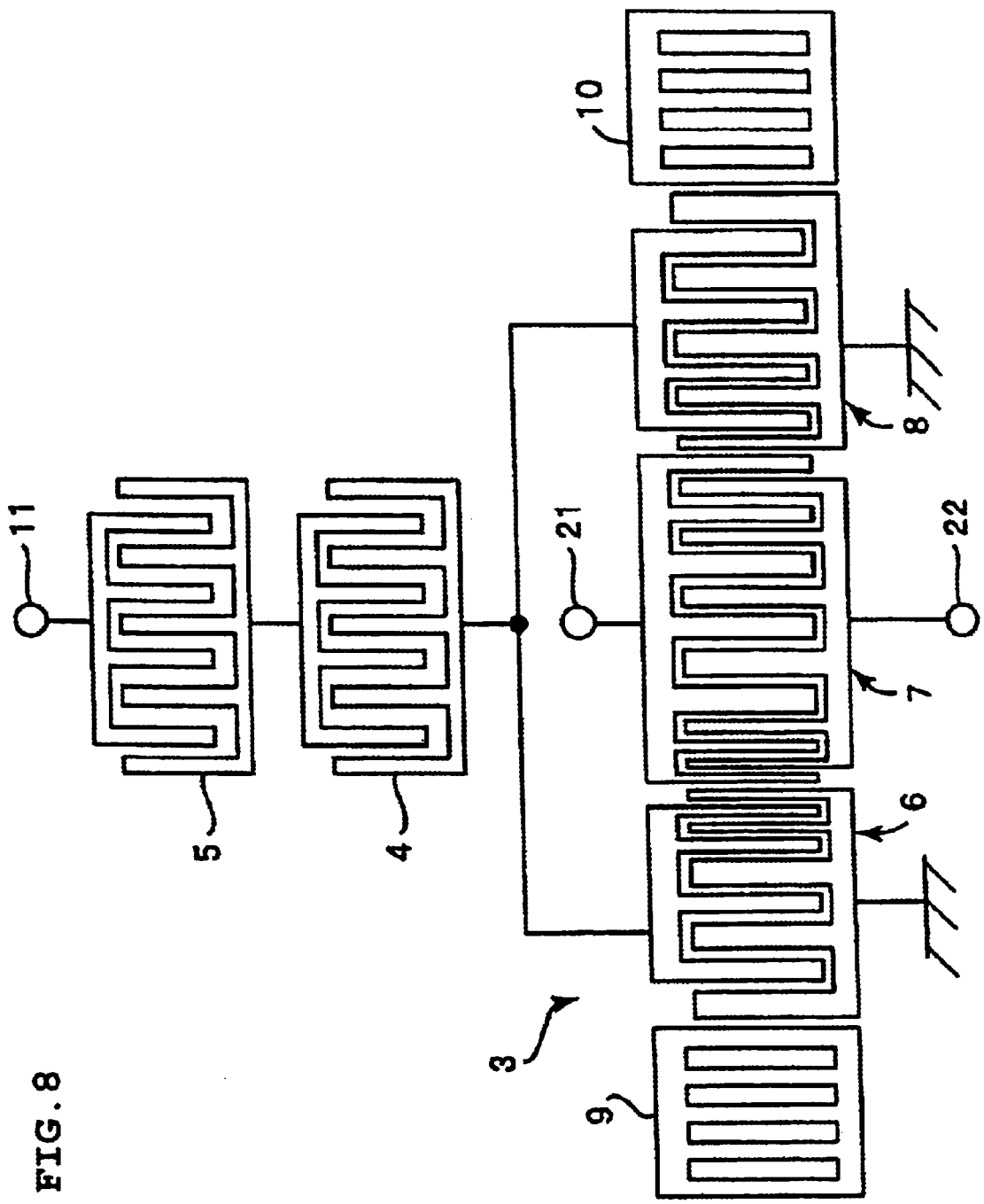
FIG. 8 shows a schematic plan view for illustrating a longitudinally coupled resonator type surface acoustic wave filter according to another modified example of the first preferred embodiment.

In addition, as shown in FIG. 8, by extracting signals from terminals 21 and 22 as output terminals, a balance-unbalance conversion function is provided. In this case, also, the same advantages as those in the above-described preferred embodiments are obtained. In contrast with the arrangement shown in FIG. 8, the terminals 21 and 22 may be used as input terminals.

Figure 9:
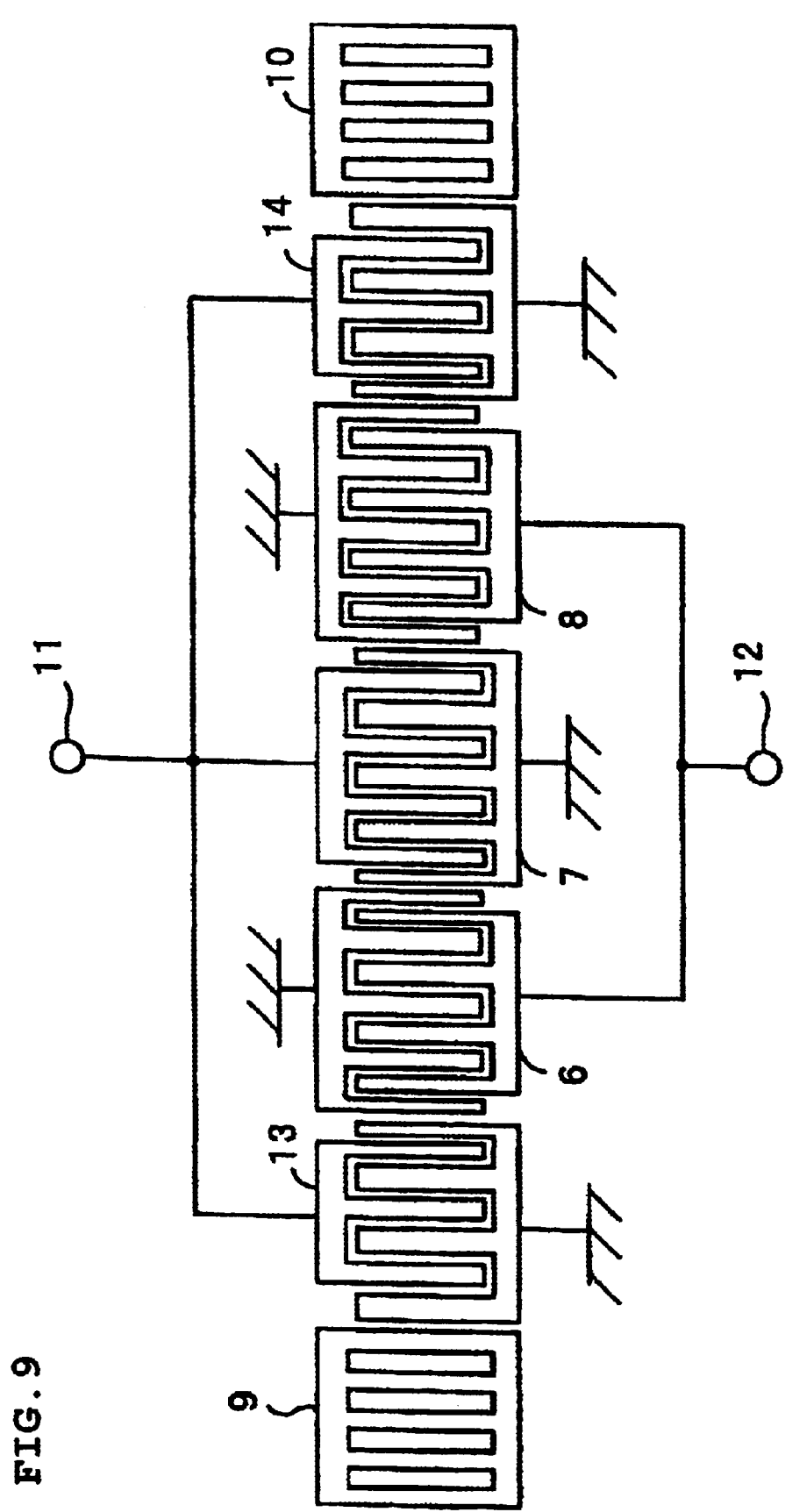
FIG. 9 shows a schematic plan view for illustrating a longitudinally coupled resonator type surface acoustic wave filter according to another modified example of the first preferred embodiment.

In addition, as shown in FIG. 9, in addition to the first to third IDTs, one or more IDTs may be arranged in the surface wave propagating direction. In a modified example shown in FIG. 9, since IDTs 13 and 14 are arranged on each side of the surface wave propagating direction on the first to third IDTs 6 to 8, an arrangement of the five IDTs is provided. In this case, similarly, when the pitches of the narrow electrode-finger pitch sections disposed in at least one IDT to IDT gap are different from the pitches of the narrow electrode-finger pitch sections disposed in the remaining IDT to IDT gap, the same advantages as those in the above-described preferred embodiments are obtained.

Figure 11:
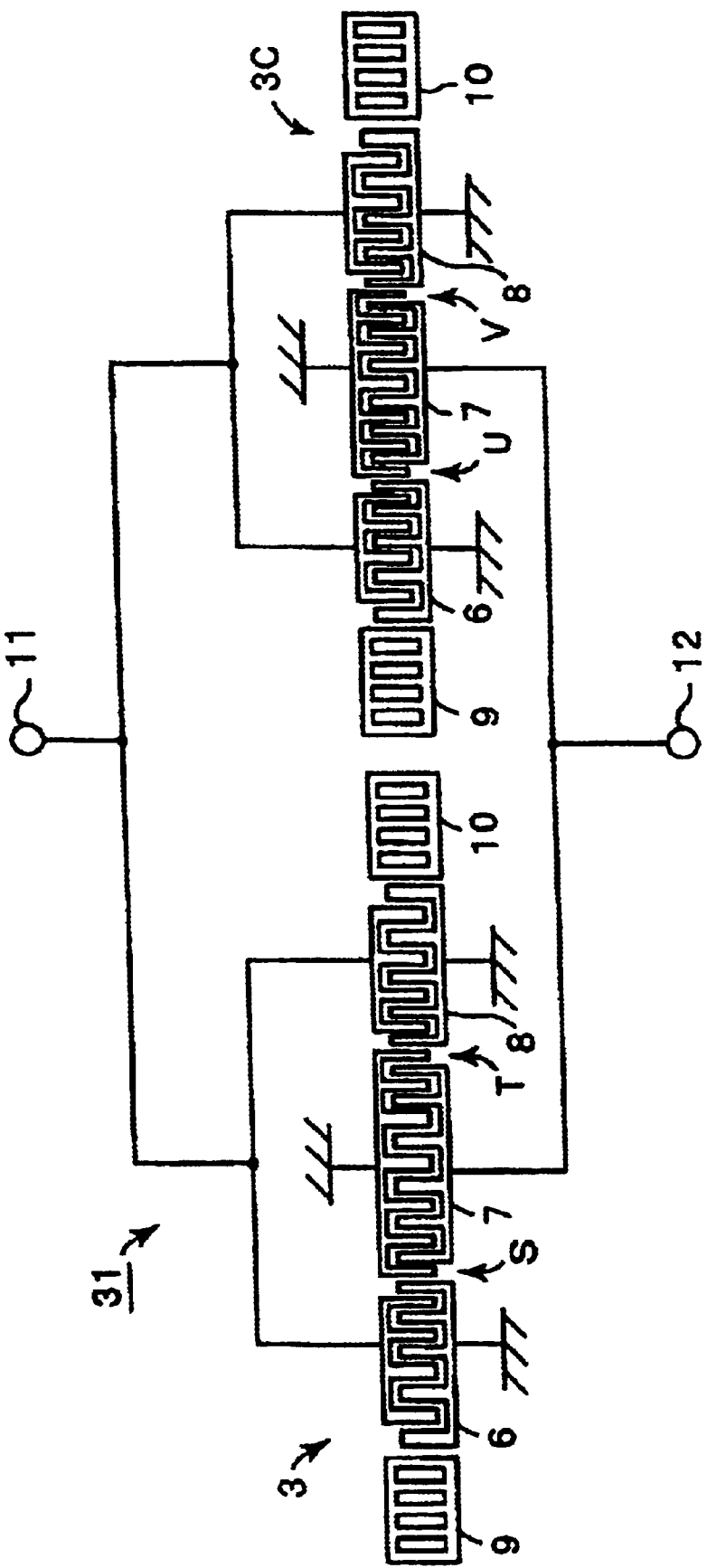
FIG. 11 shows a schematic plan view for illustrating a longitudinally coupled resonator type surface acoustic wave filter according to a second preferred embodiment.

FIG. 11 shows a schematic plan view for illustrating a longitudinally coupled resonator type surface acoustic wave filter according to a second preferred embodiment of the present invention.

In a longitudinally coupled resonator type surface acoustic wave filter 31 in this preferred embodiment, the longitudinally coupled resonator type surface acoustic wave filter unit 3 used in the first preferred embodiment is connected in parallel to a longitudinally coupled resonator type surface acoustic wave filter unit 3C having the same structure as that of the longitudinally coupled resonator type surface acoustic wave filter unit 3. In this case, the longitudinally coupled resonator type surface acoustic wave filter unit 3 preferably has substantially the same structure as that of the first preferred embodiment. However, the pitches of narrow electrode-finger pitch sections near portions indicated by arrows S and T are preferably about 1.98 $\mu$m. With respect to this, in the longitudinally coupled resonator type surface acoustic wave filter unit 3C, the pitches of narrow electrode-finger pitch sections near portions indicated by arrows U and V are preferably about 1.62 $\mu$m. Furthermore, the electrode-finger cross width W of each of the longitudinally coupled resonator type surface acoustic wave filter units 3 and 3C is preferably about half the electrode-finger cross width in the first preferred embodiment, that is, it is preferably about 34.5 $\lambda$I1. In other portions, the configuration of the longitudinally coupled resonator type surface acoustic wave filter units 3 and 3C are preferably the same as the configuration of the longitudinally coupled resonator type surface acoustic wave filter unit 3 used in the longitudinally coupled resonator type surface acoustic wave filter of the first preferred embodiment.

In the second preferred embodiment, similarly, the longitudinally coupled resonator type surface acoustic wave filter units 3 and 3C are connected in parallel to each other. Each of the longitudinally coupled resonator type surface acoustic wave filter units 3 and 3C has the same configuration as that of the longitudinally coupled resonator type surface acoustic wave filter unit 3 used in the first preferred embodiment. As a result, as in the first preferred embodiment, insertion loss in a pass band is greatly reduced, and a transversal response occurring on the high frequency side of the pass band is greatly minimized.

Furthermore, similar to the first preferred embodiment, by adjusting the pitch of the narrow pitch electrode fingers, the bandwidth is easily adjusted.

Furthermore, although in the first and second longitudinally coupled resonator type surface acoustic wave filter portions 3 and 3C according to the second preferred embodiment, the pitches of the narrow pitch electrode finger portions are different, the number of the electrode fingers in the narrow pitch electrode finger portions other than the pitches may be different. Alternatively, both of the numbers of electrode fingers and the pitches may be different. In addition, only one of longitudinally coupled resonator type surface acoustic wave filter portions 3 and 3C may include the narrow pitch electrode portion.

Figure 12:
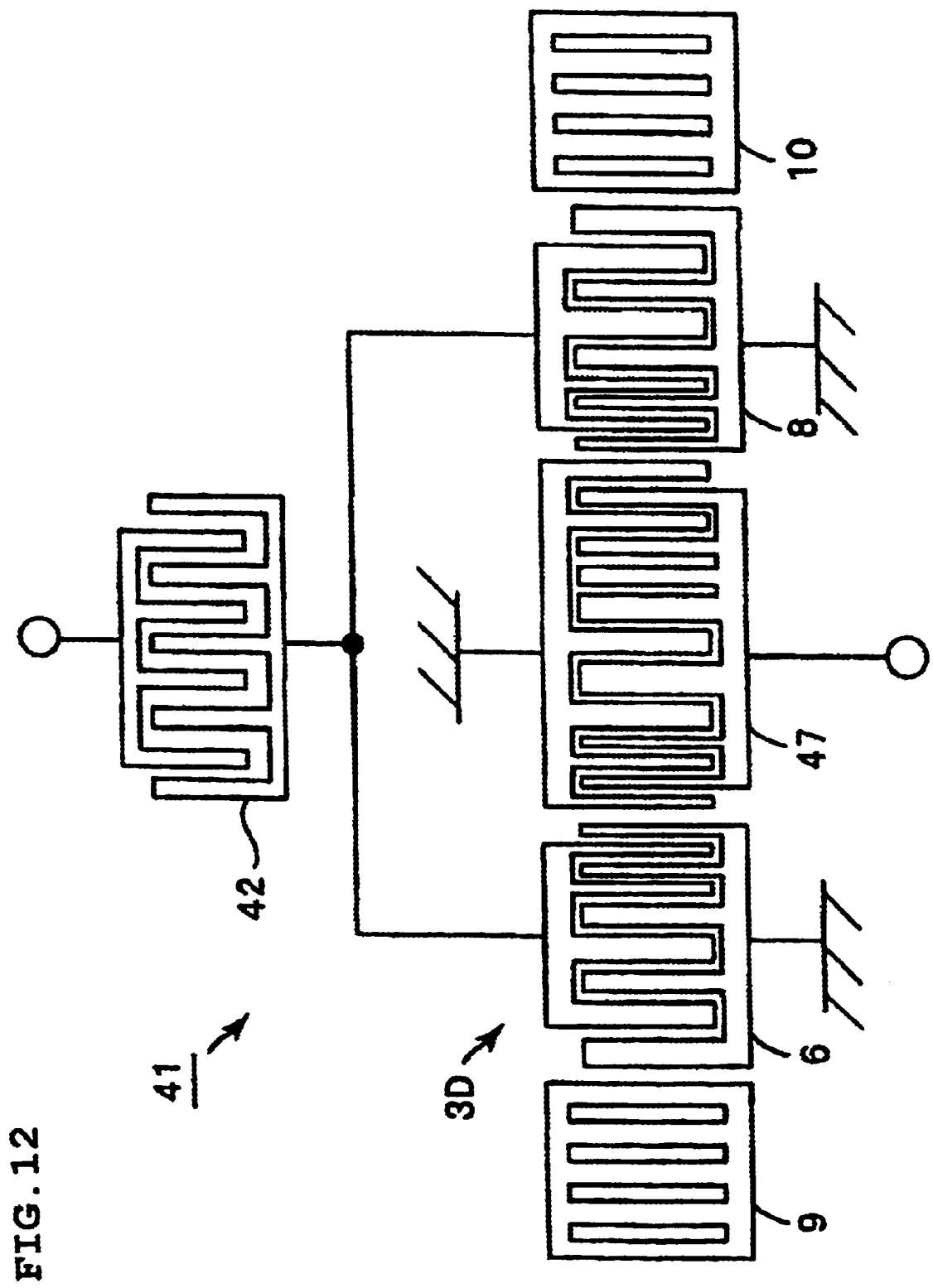
FIG. 12 shows a schematic plan view for illustrating a longitudinally coupled resonator type surface acoustic wave filter according to a third preferred embodiment.

FIG. 12 shows a schematic plan view illustrating the electrode structure of a longitudinally coupled resonator type surface acoustic wave filter according to a third preferred embodiment of the present invention.

In a longitudinally coupled resonator type surface acoustic wave filter 41 of the third preferred embodiment, a surface acoustic wave resonator 42 is connected in series to a longitudinally coupled resonator type surface acoustic wave filter unit 3D. The detailed design of the longitudinally coupled resonator type surface acoustic wave filter unit 3D is similar to that of the longitudinally coupled resonator type surface acoustic wave filter unit 3 of the first preferred embodiment. A different feature in the third preferred embodiment is that a second IDT 47 disposed in the center is subjected to thinning out and weighting.

The thinning-out and weighting is, as shown in FIG. 12, asymmetrical between the right and left sides (that is, both sides of a surface wave propagating direction) with respect to the center of the longitudinally coupled resonator type surface acoustic wave filter 41. In addition, the electrode finger cross width is preferably approximately 83.7 $\lambda$I1, and the wavelength $\lambda$I3 of the IDT is preferably approximately 1.97 $\mu$m. The other structures are substantially the same as those of the surface acoustic wave resonator filter unit 3 of the first preferred embodiment. Additionally, the surface acoustic wave resonator 4 is formed in the same manner as the surface acoustic wave resonator 4 used in the first preferred embodiment.

Figure 13:
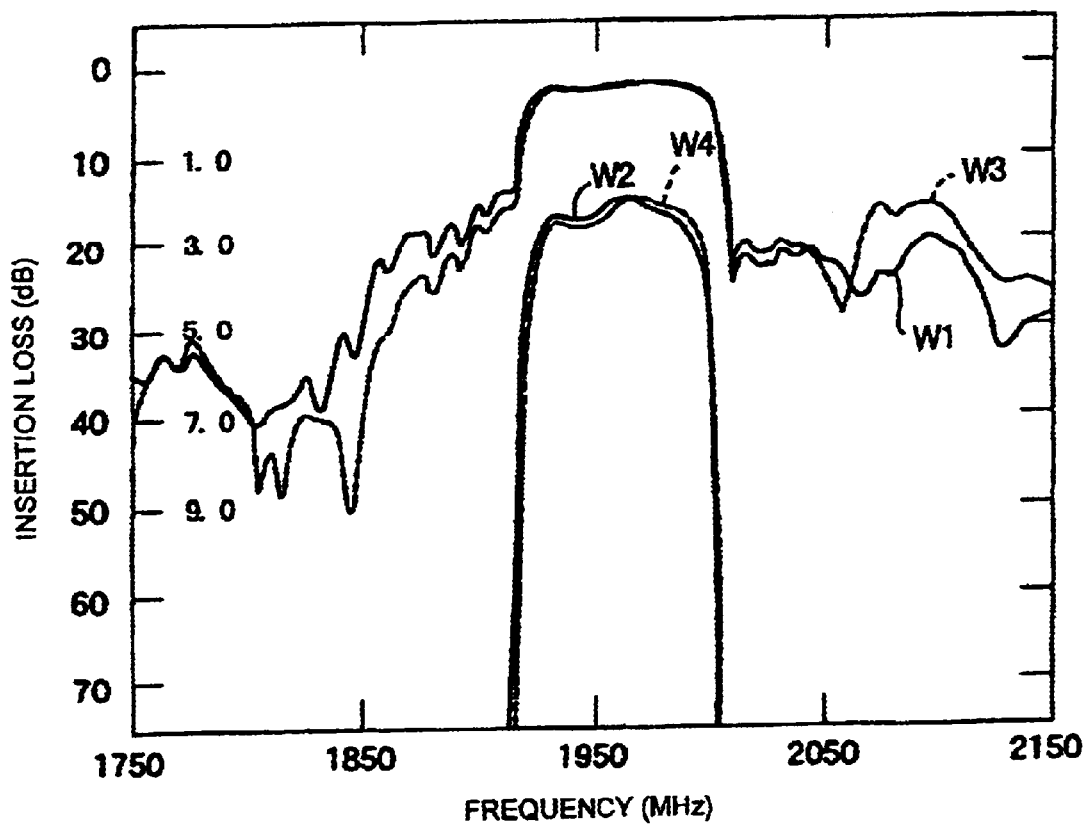
FIG. 13 shows a graph illustrating the frequency characteristics of the longitudinally coupled resonator type surface acoustic wave filter according to the third preferred embodiment and the frequency characteristics of the longitudinally coupled resonator type surface acoustic wave filter shown in FIG. 14, which is prepared for a comparison.
Figure 14:
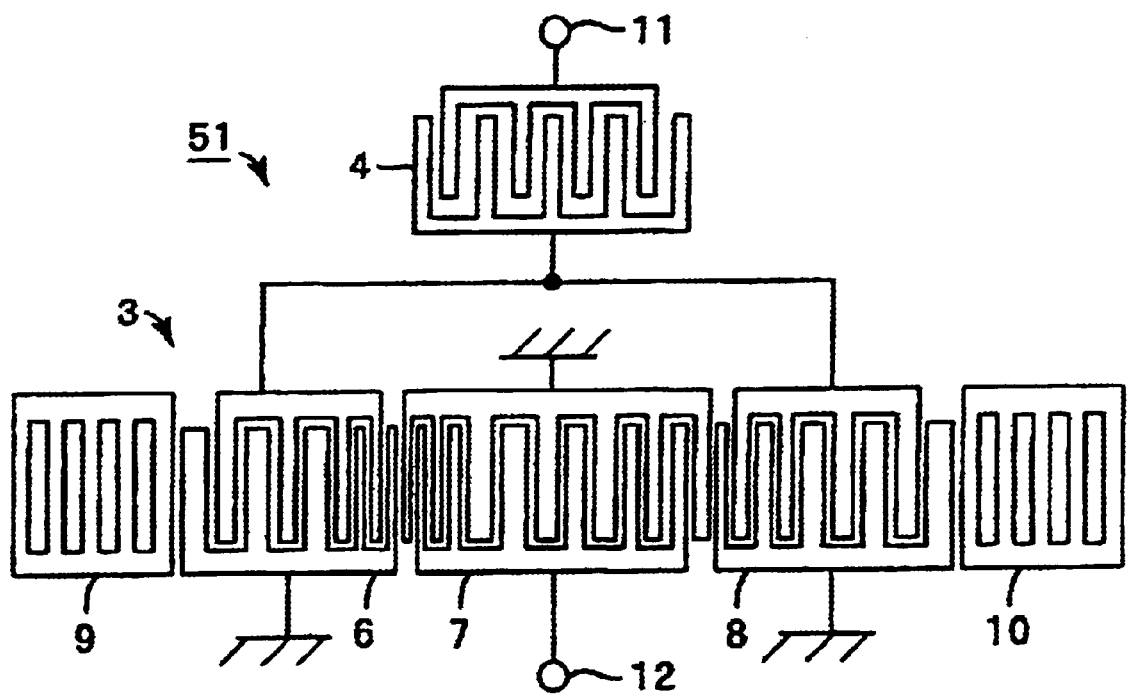
FIG. 14 shows a schematic plan view for illustrating the longitudinally coupled resonator type surface acoustic wave filter prepared to make the comparison with the third preferred embodiment.

FIG. 13 shows the frequency characteristics of the longitudinally coupled resonator type surface acoustic wave filter 41 of the third preferred embodiment. For comparison, a broken line indicates the frequency characteristics of the longitudinally coupled resonator type surface acoustic wave filter 51 shown in FIG. 14. The longitudinally coupled resonator type surface acoustic wave filter 51 shown in FIG. 14 has a configuration similar to the configuration in which the surface acoustic wave resonator 5 is removed from the longitudinally coupled resonator type surface acoustic wave filter 1 of the first preferred embodiment. The longitudinally coupled resonator type surface acoustic wave filter 51 shown in FIG. 14 is also included within the scope of the present invention.

In FIG. 13, solid lines W1 and W2 show the results of the third preferred embodiment and broken lines W3 and W4 show the results of the above compared example.

As found in FIG. 13, when the surface acoustic wave resonator 5 is removed in the longitudinally coupled resonator type surface acoustic wave filter 1 of the preferred embodiment shown in FIG. 1, the amplitude level of the transversal response is slightly greater. However, as in the third preferred embodiment, the transversal response is suppressed by thinning out and weighting the IDT 47.

As mentioned above, in the longitudinally coupled resonator type surface acoustic wave filter according to preferred embodiments of the present invention, the IDT is thinned out and weighted, preferably, asymmetrically to the surface acoustic wave propagating direction center on both sides of the propagating direction, by which the transversal response is effectively minimized and eliminated.

According to the third preferred embodiment, since the number of the surface acoustic wave resonators is one fewer than that of the first preferred embodiment, the element size of the longitudinally coupled resonator type surface acoustic wave filter is significantly miniaturized.

Figure 15:
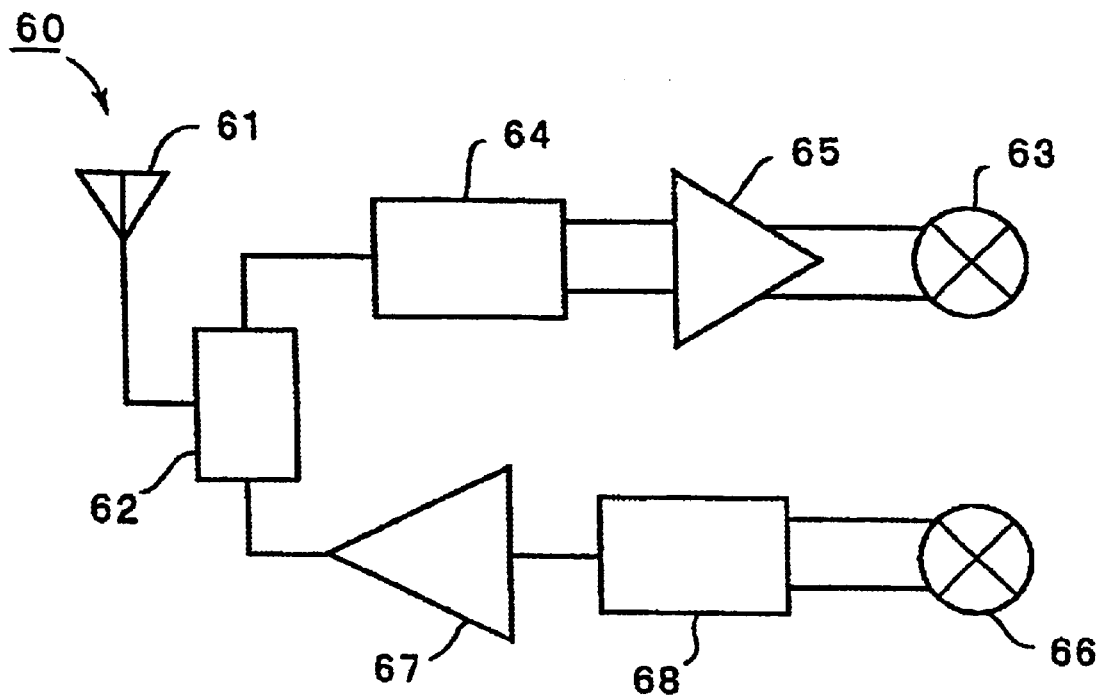
FIG. 15 shows a schematic block diagram for illustrating an example of a communication apparatus formed by using the surface acoustic wave filter according to a preferred embodiment of the present invention.
Figure 16:
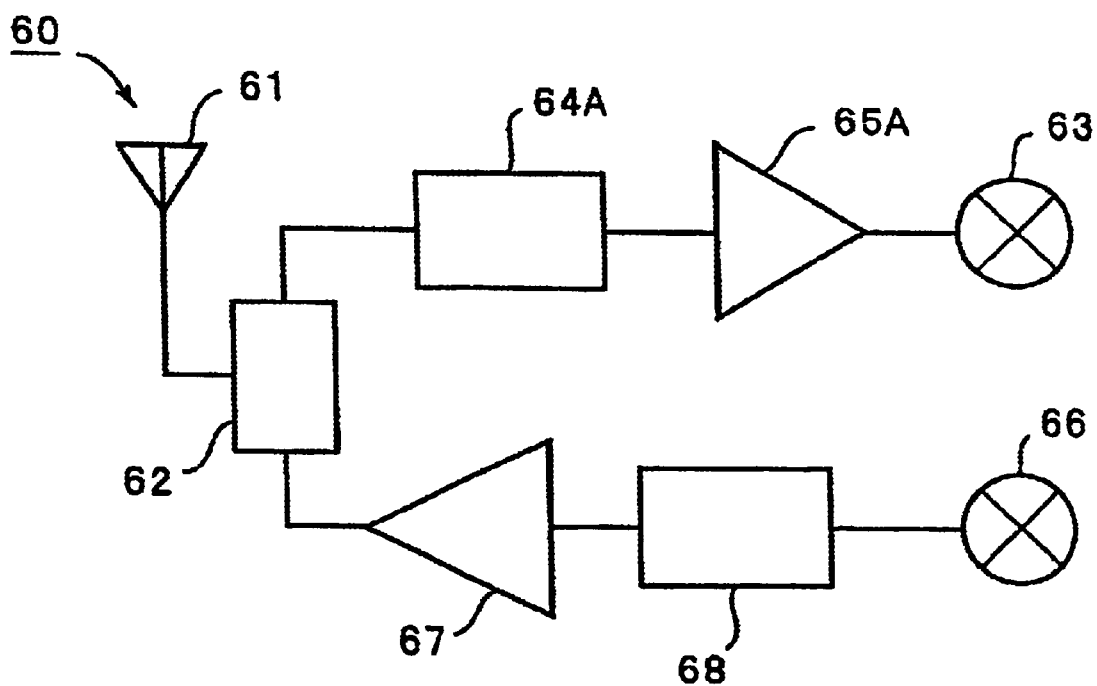
FIG. 16 shows a schematic block diagram for illustrating another example of the communication apparatus formed by using the surface acoustic wave filter according to a preferred embodiment of the present invention.

FIGS. 15 and 16 are schematic block diagrams for illustrating a communication apparatus 60 including the longitudinally coupled resonator type surface acoustic wave filter according to a preferred embodiment of the present invention.

In FIG. 15, an antenna 61 is connected to a duplexer 62. Between the duplexer 62 and a reception-side mixer 63 a surface acoustic wave filter 64 and an amplifier 65 are connected. In addition, between the duplexer 62 and a transmission-side mixer 66 an amplifier 67 and a surface acoustic wave filter 68 are connected. In this manner, when the amplifier 65 is adapted to a balanced signal, the longitudinally coupled resonator type surface acoustic wave filter in accordance with preferred embodiments of the present invention is effectively used as the surface acoustic wave filter 64.

In addition, as shown in FIG. 16, when an amplifier 65A used on the reception side is adapted to an unbalanced signal, the longitudinally coupled resonator type surface acoustic wave filter in accordance with preferred embodiments of the present invention is suitable to use as a surface acoustic wave filter 64A.

In the communication apparatus 60, by using the longitudinally coupled resonator type surface acoustic wave filter formed according to preferred embodiments of the present invention, insertion loss in a pass band is greatly reduced.

In the longitudinally coupled resonator type surface acoustic wave filter according to each of the first and second preferred embodiments of the present invention, preferably, the IDT arranged in the center of the surface wave propagating direction preferably has an even number of electrode fingers. In other words, in the first preferred embodiment, the second IDT preferably has an even number of electrode fingers, and in the second preferred embodiment, the second and fifth IDTs preferably have even numbers of electrode fingers. In the first and second preferred embodiments of the present invention, by setting the number of the electrode fingers of the central IDTs to be an even number, further loss is greatly reduced. This will be explained with reference to the fourth and fifth preferred embodiments below.

Figure 17:
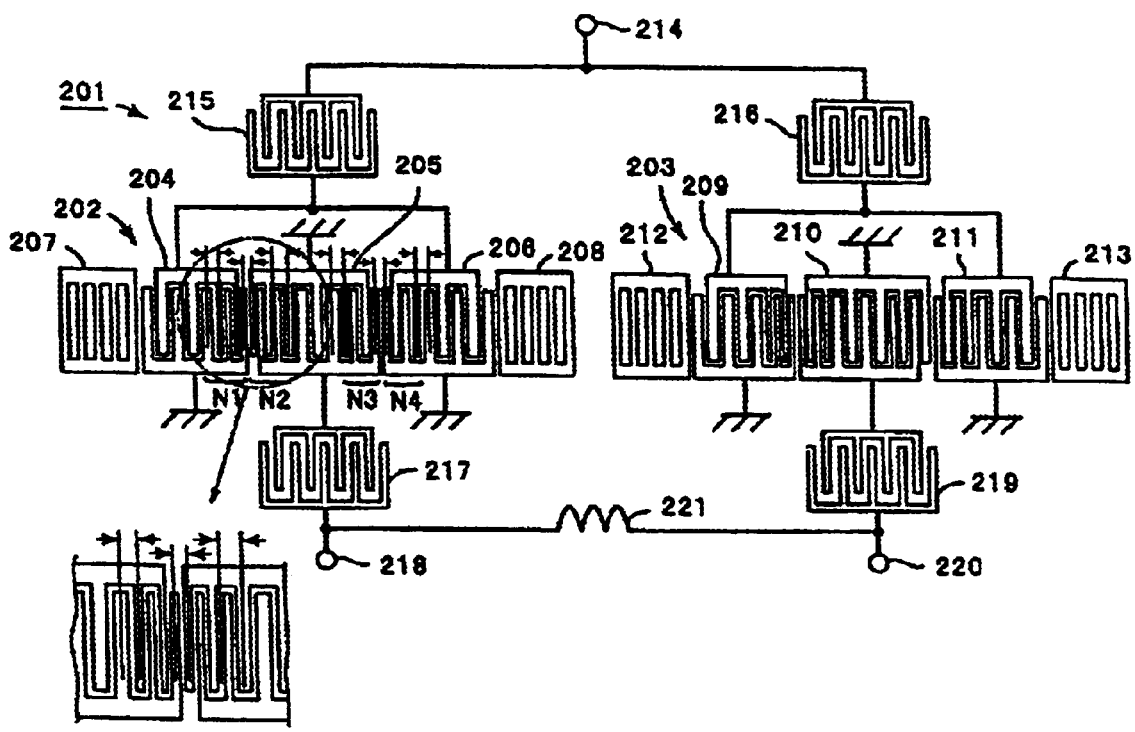
FIG. 17 shows a schematic plan view for illustrating a longitudinally coupled resonator type surface acoustic wave filter according to a fourth preferred embodiment.

FIG. 17 shows a schematic plan view illustrating the electrode structure of a longitudinally coupled resonator type surface acoustic wave filter according to the fourth preferred embodiment.

A longitudinally coupled resonator type surface acoustic wave filter 201 of this preferred embodiment includes first and second longitudinally coupled resonator type surface acoustic wave filter units 202 and 203. The longitudinally coupled resonator type surface acoustic wave filter unit 202 includes first to third IDTs 204 to 206 arranged in a surface wave propagating direction. On both sides of the region where the IDTs 204 to 206 are arranged, reflectors 207 and 208 are provided. In addition, in the second longitudinally coupled resonator type surface acoustic wave filter unit 203, fourth to sixth IDTs 209 and 211 are arranged in the surface wave propagating direction. On both sides of the IDTs 209 to 211 reflectors 212 and 213 are provided.

The longitudinally coupled resonator type surface acoustic wave filter unit 203 is similar to the longitudinally coupled resonator type surface acoustic wave filter unit 202 except that the IDT 210 has the structure in which the IDT 205 is upside down.

In the longitudinally coupled resonator type surface acoustic wave filter unit 202, in the IDTs 204 to 206, narrow electrode-finger pitch sections N1 to N4 are provided. However, the electrode-finger pitches of the narrow electrode-finger pitch sections N1 and N2 are different from the electrode-finger pitches of the narrow electrode-finger pitch sections N3 and N4.

In addition, an even number of the electrode fingers of the central IDT 205 are preferably provided.

An input terminal 214 is connected to the longitudinally coupled resonator type surface acoustic wave filter unit 202 via a surface acoustic wave resonator 215. The surface acoustic wave resonator 215 is electrically connected to one end of each of the IDTs 204 and 206. On the other hand, the input terminal 214 is connected to the longitudinally coupled resonator type surface acoustic wave filter unit 203 via a surface acoustic wave resonator 216. In this case, one end of the surface acoustic wave resonator 216 is electrically connected to each of the IDTs 209 and 211.

In addition, the IDT 205 is electrically connected to a first output terminal 218 via a surface acoustic wave resonator 217. Similarly, one end of the IDT 210 is connected to a second output terminal 220 via a surface acoustic wave resonator 219. Between the output terminal 218 and the output terminal 220 an inductance 221 is connected.

In this preferred embodiment, as mentioned above, a first filter, in which the longitudinally coupled resonator type surface acoustic wave filter unit 202 is connected in series to the surface acoustic wave resonators 215 and 217, is connected in parallel to a filter in which the longitudinally coupled resonator type surface acoustic wave filter unit 203 is connected in series to the surface acoustic wave resonators 216 and 219. With this arrangement, signals having a phase difference of 180° are output from the output terminals 218 and 220. As a result, there is provided a balance-unbalance conversion function.

Figure 18:
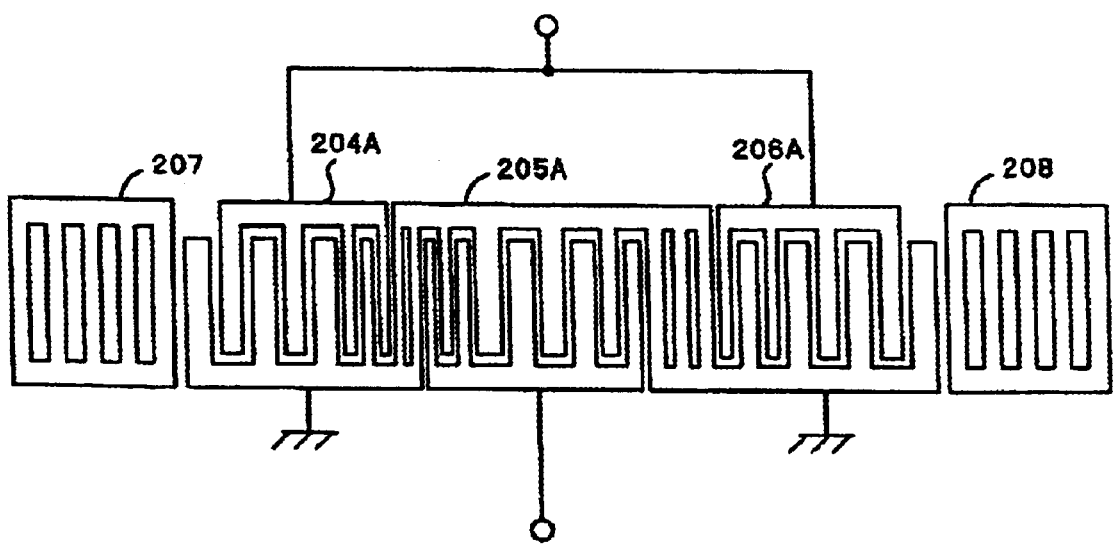
FIG. 18 shows a schematic plan view for illustrating one longitudinally coupled resonator type surface acoustic wave filter unit in the longitudinally coupled resonator type surface acoustic wave filter according to the fourth preferred embodiment.

FIG. 18 shows a schematic plan view illustrating the electrode structure of a modified example of the longitudinally coupled resonator type surface acoustic wave filter unit 202 shown in FIG. 17. As shown in FIG. 18, first to third IDTs 204A to 206A have a configuration in which comb-shaped electrodes are connected to ground potentials. In addition, in the longitudinally coupled resonator type surface acoustic wave filter unit 203, similarly, fourth to sixth IDTs 209 to 211 are configured to electrically connect comb-shaped electrodes to ground potentials.

Next, the operation of the longitudinally coupled resonator type surface acoustic wave filter 201 of the preferred embodiment will be explained based on a more detailed experimental example.

In this experimented example, the above electrodes are provided on a 40±5° Y-cut X-propagation LiTaO$_3$ substrate. The details of the electrodes will be given below, when the wavelength of a surface wave determined by the pitches of the narrow electrode-finger pitch sections N3 and N4 is preferably about $\lambda$I2, the wavelength determined by the pitches of the narrow electrode-finger pitch sections N3 and N4 is preferably about $\lambda$I3, and the wavelength determined by the pitches of the remaining electrode fingers is preferably about $\lambda$I1.

The electrode-finger cross width W1 of each of the IDTs 204 to 206 and the IDTs 209 to 211 is substantially equal to about 41.7 $\lambda$I1.

The number of the electrode fingers of the IDTs 204 and 209: the number of the electrode fingers of the narrow electrode-finger pitch section is set to be 4 and the number of the electrode fingers of the remaining electrode-finger section is set to be 21.

In the IDTs 205 and 210, the number of the electrode fingers of the narrow electrode-finger pitch section N2 is set to be 4; the number of the electrode fingers of the narrow electrode-finger pitch section N3 is set to be 4, and the number of the remaining electrode fingers is set to be 24.

In IDTs 206 and 211, the number of the electrode fingers of the narrow electrode-finger pitch section N4 is set to be 4 and the number of the electrode fingers of the remaining electrode finger section is set to be 21.

λI1 is 2.04 μm, λI2 is about 1.85 μm, and λI3 is about 1.99 μm.

The wavelength λR of each reflector is about 2.05 μm.

The number of the electrode fingers of each reflector is 100.

The distance between the electrode-finger centers of the narrow electrode-finger pitch sections N1 and N2 and the continued remaining electrode fingers is about 0.25 λI1+ 0.25 λI2

The distances between the electrode-finger centers of the narrow electrode-finger pitch sections N3 and N4 and the remaining electrode fingers continuing to the sections is about 0.25 λI1+0.25 λI3

The distance between the electrode-finger centers of the IDTs 204 and 205 and the distance between the electrode-finger centers of the IDTs 209 and 210 (that is, the gaps between the IDTs) are set to be about 0.50 λI2.

The distance between the electrode-finger centers of the IDTs 205 and 206 and the distance between the electrode-finger centers of the IDTs 210 and 211 (that is, the gaps between the IDTS) are set to be about 0.50 λI3.

The gaps between the IDTs and the reflectors are about 0.55 λR.

The duty of each of the IDTs is about 0.60.

The duty of each reflector is about 0.60.

The electrode film thickness is about 0.08 λI1.

The value of an inductance 220 is 27 nH.

The details of the surface acoustic wave resonators 215, 216, 217, and 219 will be presented in Table 3 given below.

TABLE 3

|  | RESONATOR | |
|---|---|---|
|  | 215, 216 | 217, 219 |
| CROSS WIDTH | 40.8 λ | 24.6 λ |
| NUMBER OF IDT | 141 | 341 |
| WAVELENGTH λ (IDT AND REFLECTOR) | 1.96 μm | 2.03 μm |
| IDT-REFLECTOR GAP | 0.50 λ | 0.50 λ |
| NUMBER OF REFLECTOR | 30 | 30 |
| DUTY (IDT AND REFLECTOR) | 0.60 | 0.60 |
| ELECTRODE FILM THICKNESS | 0.083 λ | 0.080 λ |

Figure 19:
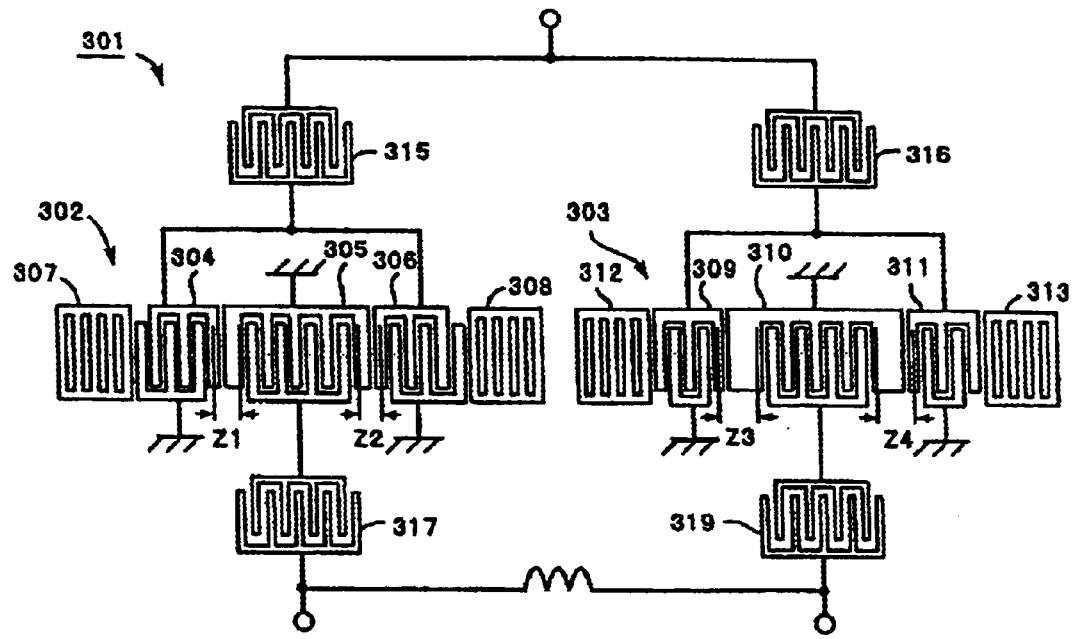
FIG. 19 shows a schematic plan view for illustrating a longitudinally coupled resonator type surface acoustic wave filter prepared for comparison to preferred embodiments of the present invention.

FIG. 19 shows a schematic plan view illustrating a conventional longitudinally coupled resonator type surface acoustic wave filter prepared for a comparison with the longitudinally coupled resonator type surface acoustic wave filter 201 of the fourth preferred embodiment. In a conventional longitudinally coupled resonator type surface acoustic wave filter 301, the configuration is substantially the same as that of the longitudinally coupled resonator type surface acoustic wave filter 201 of the fourth preferred embodiment, except that there are no narrow electrode-finger pitch sections in longitudinally coupled resonator type surface acoustic wave filter units 302 and 303. The design of the longitudinally coupled resonator type surface acoustic wave filter 301 prepared for the comparison will be given in details below.

The electrode-finger cross width W is about 29.7 λI1.

The number of the electrode fingers of IDTs: IDTs 304 and 306 have 23; an IDT 305 has 35; IDTs 309 and 311 have 22; and an IDT 310 has 35.

The wavelength λI1 of each of the IDTs is about 2.02 μm.

The wavelength λR of each of reflectors 307, 308, 312, and 313 is about 2.05 μm.

The number of the electrode fingers of each of the reflectors 307, 308, 312, 313 is 100.

The gap between the IDTs in the longitudinally coupled resonator type surface acoustic wave filter unit 302 is about 0.785 λI.

The gap between the IDTs in the longitudinally coupled resonator surface acoustic wave filter unit 303 is about 1.285 λI.

The gap between the IDTs and the reflectors is about 0.52 λR.

The duty of each IDT is about 0.60.

The duty of each reflector is about 0.60.

The electrode film thickness is about 0.08 λI.

The designs of the surface acoustic wave resonators 315, 316, 317, and 319 will be shown in Table 4 below.

TABLE 4

|  | RESONATOR | |
|---|---|---|
|  | 315, 316 | 317, 319 |
| CROSS WIDTH | 19.8 λ | 34.7 λ |
| NUMBER OF IDT | 281 | 281 |
| WAVELENGTH λ (IDT AND REFLECTOR) | 2.02 μm | 2.02 μm |
| IDT-REFLECTOR GAP | 0.50 λ | 0.50 λ |
| NUMBER OF REFLECTOR | 30 | 30 |
| DUTY (IDT AND REFLECTOR) | 0.60 | 0.60 |
| ELECTRODE FILM THICKNESS | 0.080 λ | 0.080 λ |

Figure 20:
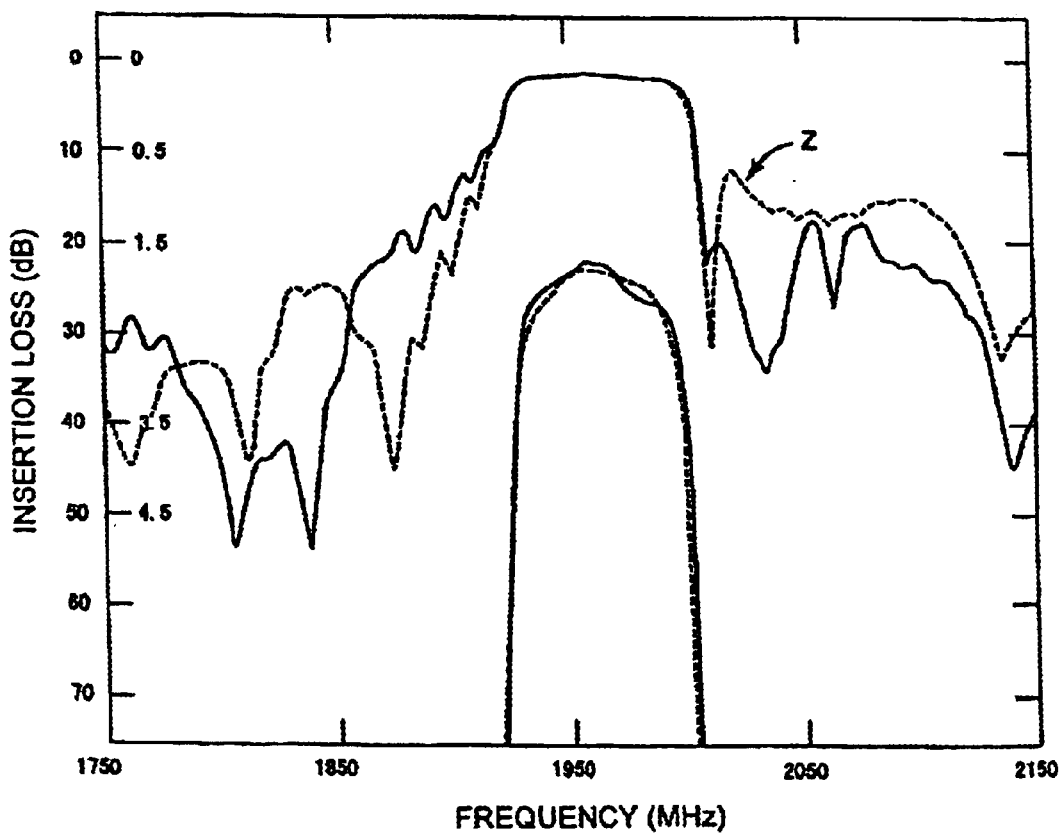
FIG. 20 shows a graph illustrating the frequency characteristics of the longitudinally coupled resonator type surface acoustic wave filters of both the fourth preferred embodiment and the conventional example shown in FIG. 19.

FIG. 20 shows the frequency characteristics of the longitudinally coupled resonator type surface acoustic wave filter 201 shown in FIG. 17 and the conventional longitudinally coupled resonator type surface acoustic wave filter 301 shown in FIG. 19 for comparison. In FIG. 20, a solid line shown indicates the result obtained by the fourth preferred embodiment and a broken line indicates the characteristics of the conventional longitudinally coupled resonator type surface acoustic wave filter 301 prepared for the comparison. In addition, in FIG. 20, characteristics indicated by enlarging the main portion of the frequency characteristics with the vertical-axis right scale are shown.

As found in FIG. 20, in the fourth preferred embodiment, a transversal response indicated by an arrow Z is approximately 5 dB lower than that of the conventional example. In this situation, the insertion loss in a pass band, and the pass-band width near 4 dB from a through-level are almost the same as the conventional example. Therefore, in this preferred embodiment, when compared with the conventional longitudinally coupled resonator type surface acoustic wave filter 301, without changing the insertion loss and the bandwidth, the transversal response is greatly reduced.

Figure 21:
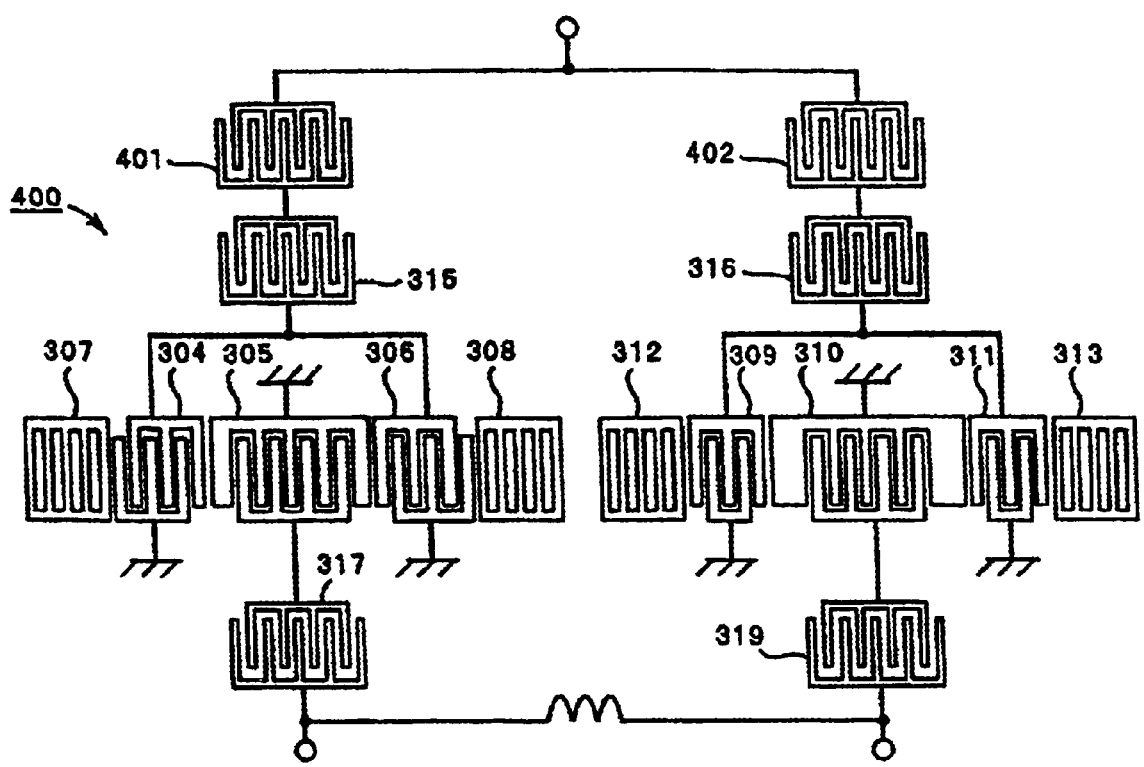
FIG. 21 shows a schematic plan view for illustrating another conventional longitudinally coupled resonator type surface acoustic wave filter prepared for comparison to preferred embodiments of the present invention.

In the longitudinally coupled resonator type surface acoustic wave filter 301, as a method for suppressing the transversal response, there is considered a way of adding another surface acoustic wave resonator in series. So, as shown in FIG. 21, on the input side of the longitudinally coupled resonator type surface acoustic wave filter 301, a longitudinally coupled resonator type surface acoustic wave filter 400 is provided in which surface acoustic wave resonators 401 and 402 are added. In this case, the specifications of the surface acoustic wave resonators 401 and 402 will be shown in Table 5 below.

TABLE 5

| | |
|---|---|
| CROSS WIDTH | 20.3 λ |
| NUMBER OF IDT | 141 |
| WAVELENGTH λ (IDT AND REFLECTOR) | 1.97 μm |
| IDT-REFLECTOR GAP | 0.50 λ |
| NUMBER OF REFLECTOR | 30 |
| DUTY (IDT AND REFLECTOR) | 0.60 |
| ELECTRODE FILM THICKNESS | 0.082 λ |

Figure 22:
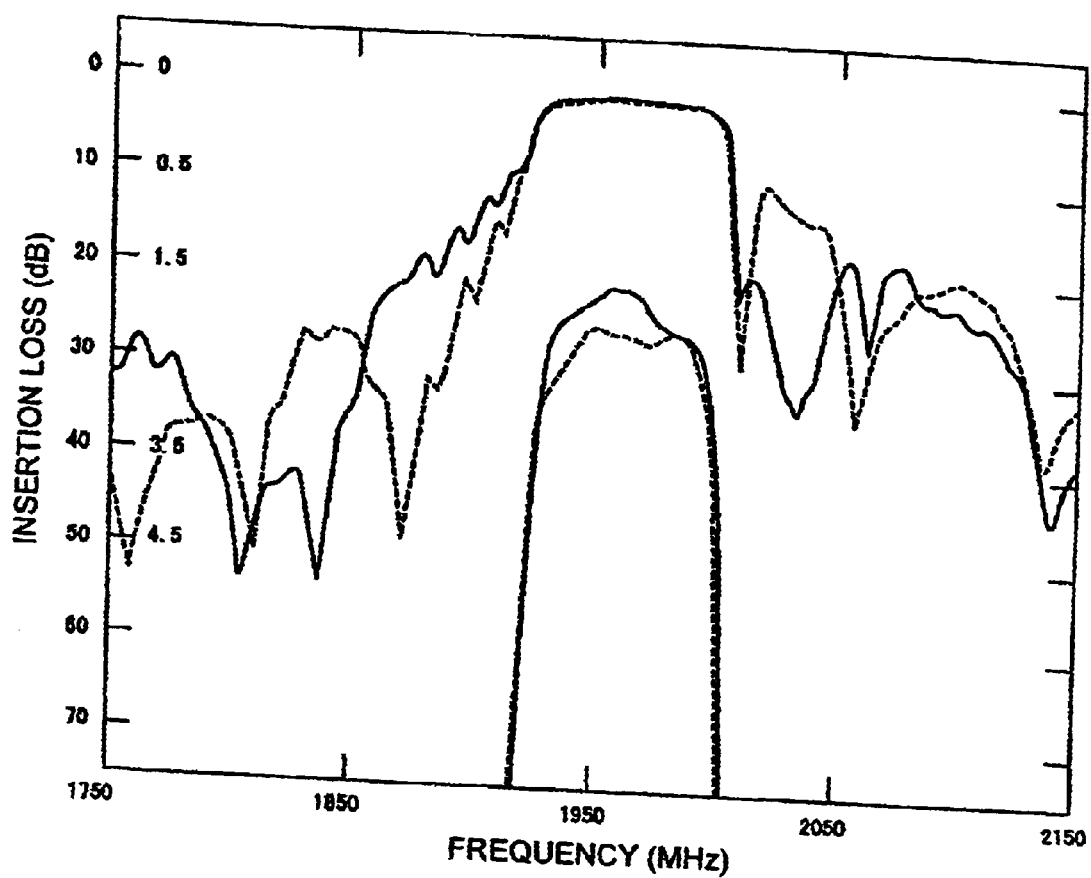
FIG. 22 shows a graph illustrating the frequency characteristics of the longitudinally coupled resonator type surface acoustic wave filter of the fourth preferred embodiment and the conventional example shown in FIG. 21.

FIG. 22 shows the frequency characteristics of the longitudinally coupled resonator type surface acoustic wave filter 400 and the frequency characteristics of the longitudinally coupled resonator type surface acoustic wave filter of the fourth preferred embodiment. In the longitudinally coupled resonator type surface acoustic wave filter 400, according to the addition of the surface acoustic wave resonators 401 and 402, some design parameters of the other components are changed.

In FIG. 22, a solid line shows the result of the fourth preferred embodiment and a broken line shows the result of the longitudinally coupled resonator type surface acoustic wave filter 400.

As shown in FIG. 22, by adding surface acoustic wave resonators 401 and 402 to the longitudinally coupled resonator type surface acoustic wave filter 301, in the longitudinally coupled resonator type surface acoustic wave filter 400, attenuation at over 2050 MHz is improved when compared with the fourth preferred embodiment. However, attenuation near about 2010 MHz to about 2050 MHz is deteriorated when compared with the fourth preferred embodiment. In addition, the impedance of the filter is increased by adding the surface acoustic wave resonators 401 and 402, with the result that insertion loss in the pass band increases.

In addition, when the surface acoustic wave resonators 401 and 402 are added, the device cannot be miniaturized.

As a result, by using the longitudinally coupled resonator type surface acoustic wave filter 201 of the fourth preferred embodiment, a surface acoustic wave filter is provided which permits smaller insertion loss in the pass band and less transversal responses than those in the conventional longitudinally coupled resonator type surface acoustic wave filter 301 and the surface acoustic wave filter 400 using many surface acoustic wave resonators.

Figure 23:
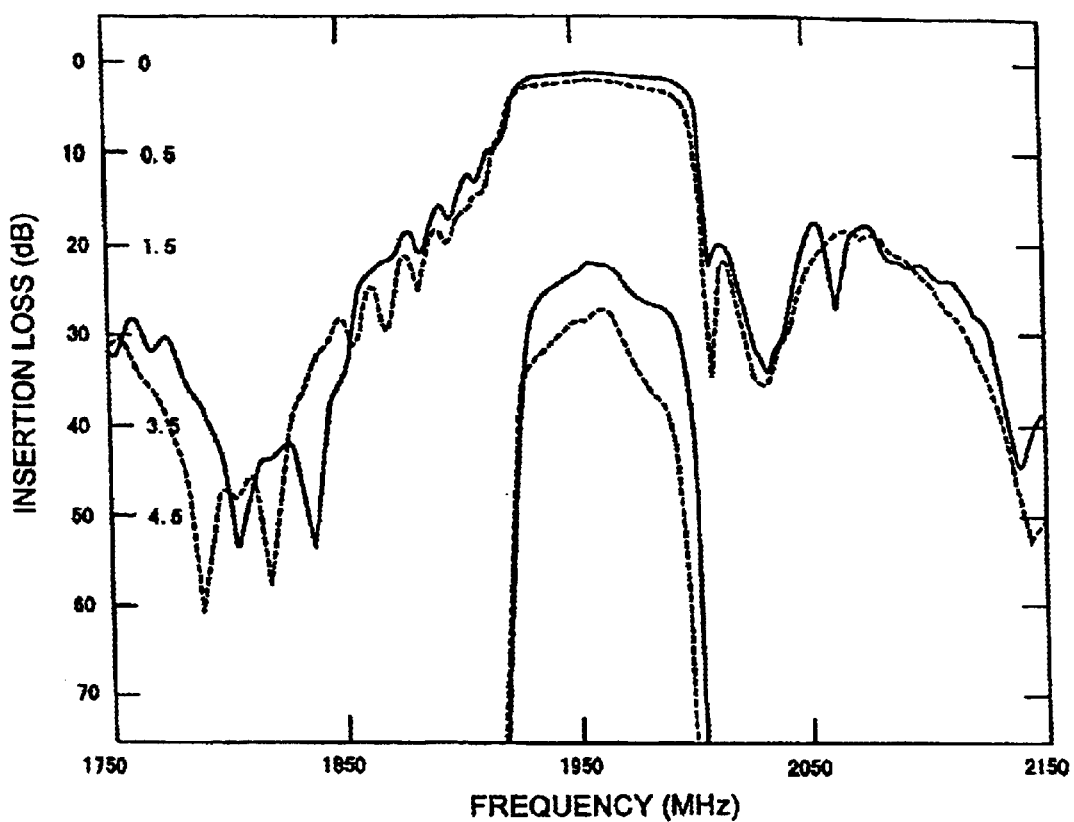
FIG. 23 shows a graph illustrating the frequency characteristics of the longitudinally coupled resonator type surface acoustic wave filter of the fourth preferred embodiment and the longitudinally coupled resonator type surface acoustic wave filter shown in FIG. 21, which is modified by the method described in the conventional art.

Next, FIG. 23 shows results obtained by the comparison between the frequency characteristics of the aforementioned longitudinally coupled resonator type surface acoustic wave filter described in Japanese Unexamined Patent Application Publication No.10-190394 and the frequency characteristics of the longitudinally coupled resonator type surface acoustic wave filter of the fourth preferred embodiment. The structure of the surface acoustic wave filter prepared for the comparison is substantially the same as that of the longitudinally coupled resonator type surface acoustic wave filter shown in FIG. 19. The details about the design of the filter for the comparison will be presented as follows:

The cross width W is about 29.7 λI.

The number of the electrode fingers of an IDT, the number of the electrode fingers of the central IDT are 37, and the numbers of the electrode fingers of IDTs disposed on both sides of the central IDT are 23.

The wavelength λI of each IDT is about 2.04 μm.

The wavelength λR of each reflector is about 2.05 μm.

The number of the electrode fingers of each reflector is 100.

The gap between the IDTs: the gap between the IDTs indicated by the arrow Z1 shown in FIG. 21 is about 0.370 λI, the gap between the IDTs indicated by the arrow Z2 is about 0.690 λI, the gap between the IDTs indicated by the arrow Z3 is about 0.870 λI, and the gap between the IDTs indicated by the arrow Z4 is about 1.190 λI.

The IDT-reflector gap is about 0.52 λR.

The IDT duty is about 0.60.

The reflection duty is about 0.60.

The electrode film thickness is about 0.08 λI.

The detailed designs of the surface acoustic wave resonators 315 and 316, and the surface acoustic wave resonators 317 and 319 is presented in Table 6 given below.

TABLE 6

| | RESONATOR | |
|---|---|---|
| | 315, 316 | 317, 319 |
| CROSS WIDTH | 19.8 λ | 34.7 λ |
| NUMBER OF IDT | 341 | 281 |
| WAVELENGTH λ (IDT AND REFLECTOR) | 2.02 μm | 2.02 μm |
| IDT-REFLECTOR GAP | 0.50 λ | 0.50 λ |
| NUMBER OF REFLECTOR | 30 | 30 |
| DUTY (IDT AND REFLECTOR) | 0.60 | 0.60 |
| ELECTRODE FILM THICKNESS | 0.080 λ | 0.080 λ |

As shown in FIG. 23, in the frequency characteristics (the broken lines shown in FIG. 23) of the longitudinally coupled resonator type surface acoustic wave filter formed according to the longitudinally coupled resonator type surface acoustic wave filter described in Japanese Unexamined Patent Application Publication No. 10-190394, when compared with the frequency characteristics (solid lines) of the longitudinally coupled resonator type surface acoustic wave filter of the fourth embodiment, the insertion loss in a pass band is not at adequate levels and the pass-band width is narrower. In this manner, by using the longitudinally coupled resonator type surface acoustic wave filter of the fourth preferred embodiment, as compared with the case in which the surface acoustic wave filter described in the conventional art is used, without causing substantial deterioration in the insertion loss, the transversal response is effectively reduced.

There will be given a description about the reason that the central IDTs 205 and 210 have even electrode fingers in the fourth preferred embodiment.

In the longitudinally coupled resonator type surface acoustic wave filter of the fourth preferred embodiment, reduced the transversal response is effectively obtained, as shown in the first preferred embodiment, by differing the electrode-finger pitches of the narrow electrode-finger pitch sections on both sides of each of the central IDTS. That is, the central IDTs may have an odd number of electrode fingers.

Figure 24:
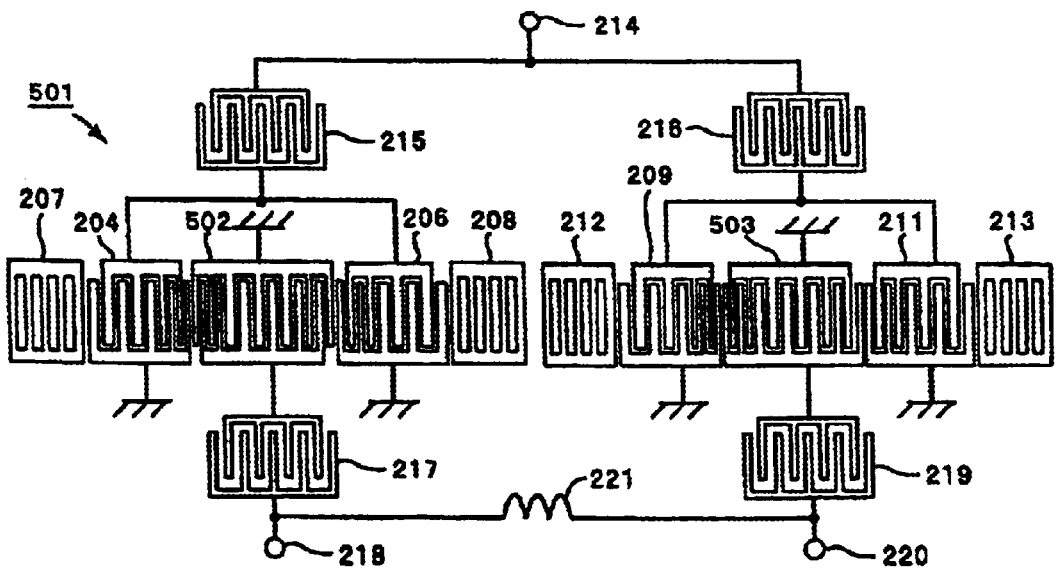
FIG. 24 shows a schematic plan view of a modified example of the fourth preferred embodiment, illustrating a longitudinally coupled resonator type surface acoustic wave filter including central IDTs that have an odd number of electrode fingers.

However, as shown in FIG. 24, in the longitudinally coupled resonator type surface acoustic wave filter 501, when the central IDTs 502 and 503 have an odd number of electrode fingers such that the most appropriate design is provided, a large pitch-difference between the narrow electrode-finger pitch sections on both sides of each of the central IDTs 502 and 503 occurs. As a result, when the electrode-finger pitch of the one-side narrow electrode-finger pitch sections of each of the central IDTs is extremely narrow, the continuity of the surface acoustic wave propagating pathway is lost, thereby substantially increasing the insertion loss in a pass band.

Therefore, in preferred embodiments of the present invention, preferably, the central IDTs have an even number of electrode fingers. With this arrangement, the difference of the electrode-finger pitches between the narrow electrode-finger pitch sections on both sides of each central IDT is greatly decreased. As a result, the insertion loss in the pass band is effectively reduced.

In addition, in a filter used for handling a high frequency such as the PCS system, when the electrode-finger pitch is narrow, the widths of electrode fingers and the gap between the electrode fingers also become narrow. Thus, by configuring the central IDTs to have an even number of electrode fingers, the difference between the electrode finger pitches on both sides of each of the central IDTs is greatly reduced. In other words, since the narrowest electrode-finger pitch can be widened, a desired IDT is easily obtained.

Figure 25:
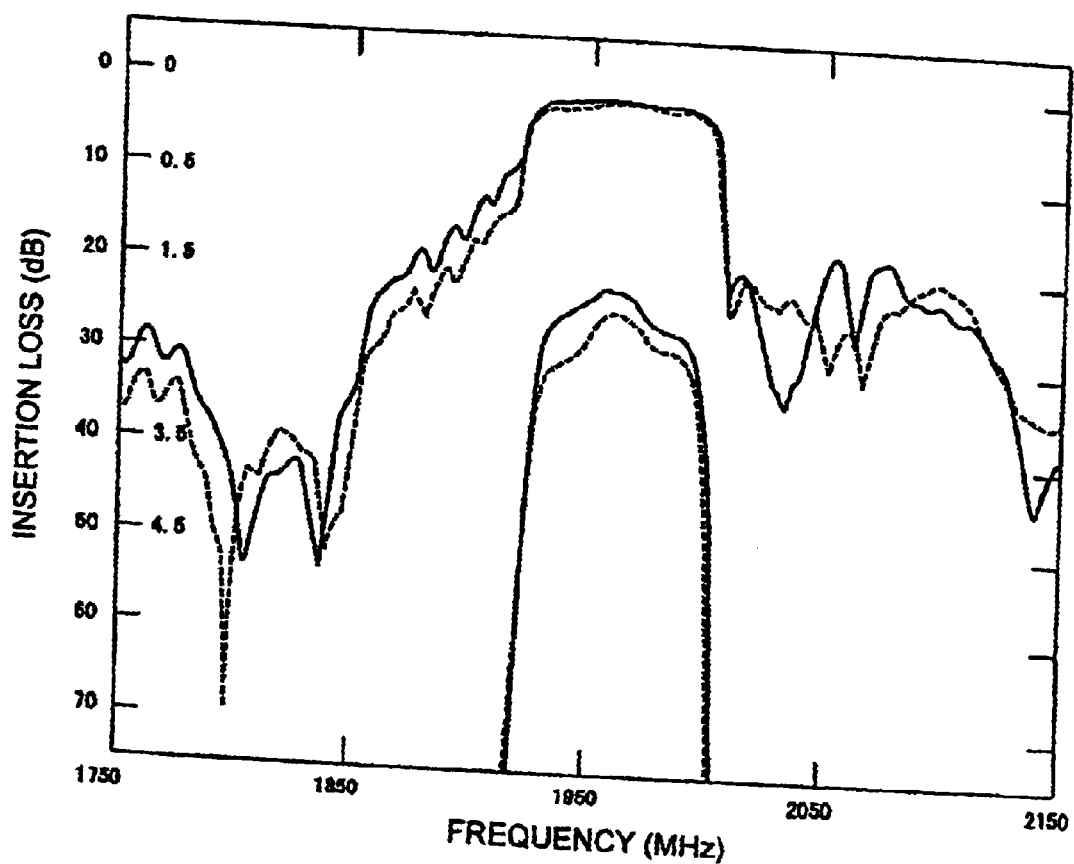
FIG. 25 shows a graph of the frequency characteristics of both the fourth preferred embodiment and the longitudinally coupled resonator type surface acoustic wave filter as the modified example shown in FIG. 24.

FIG. 25 shows the frequency characteristics of the longitudinally coupled resonator type surface acoustic wave filter of the fourth preferred embodiment and the longitudinally coupled resonator type surface acoustic wave filter shown in FIG. 24 as a modified example of the fourth preferred embodiment. A solid line given in FIG. 25 indicates the fourth preferred embodiment and a broken line indicates the frequency characteristics of the modified example shown in FIG. 24. In the characteristics shown in FIG. 25, the characteristics of the longitudinally coupled resonator type surface acoustic wave filter shown in FIG. 24 are characteristics obtained by configuring the central IDTs to have an odd number of electrode fingers and the pitches of the narrow electrode-finger pitch sections on both sides of each of the central IDTs are preferably about 1.62 µm and about 1.98 µm. That is, electrode finger sections having pitches of about 0.23 µm narrower than the narrowest pitch of the electrode-finger pitch of the fourth preferred embodiment are provided.

As seen in FIG. 25, attenuation in the transversal response in the modified example increases by approximately 2 dB, which is greater than the attenuation in the fourth preferred embodiment. However, the insertion loss in the pass band is greater than that of the fourth preferred embodiment.

Thus, as in the fourth preferred embodiment, by configuring the central IDTs to have an even number of electrode fingers, the transversal response is greatly reduced and the insertion loss in the pass band is also greatly reduced.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A longitudinally coupled resonator type surface acoustic wave filter comprising:
   a piezoelectric substrate; and
   first, second and third IDTs provided on the piezoelectric substrate and arranged in a surface wave propagating direction such that the second IDT is interposed between the first and the third IDTs, each of the first, second and third IDTs having a plurality of electrode fingers; wherein
   the first and second IDTs have narrow electrode-finger pitch sections which have an electrode-finger pitch narrower than the remaining electrode-finger pitches, at respective end portions of the first and second IDTs adjacent to each other;
   the second and third IDTs have narrow electrode-finger pitch sections which have an electrode-finger pitch that is narrower than the remaining electrode-finger pitches, at respective end portions of the second and third IDTs adjacent to each other; and
   the electrode-finger pitch of the narrow electrode-finger pitch sections in the first and second IDTs is different from the electrode-finger pitch of the narrow electrode-finger pitch sections in the second and third IDTs.

2. A longitudinally coupled resonator type surface acoustic wave filter according to claim 1, wherein a number of the electrode fingers of the narrow electrode-finger pitch sections in the first and second IDTs is different from a number of the electrode fingers of the narrow electrode-finger pitch sections in the second and third IDTs.

3. A longitudinally coupled resonator type surface acoustic wave filter according to claim 1, wherein the second IDT has an even number of electrode fingers.

4. A longitudinally coupled resonator type surface acoustic wave filter according to claim 1, wherein at least one of the IDTs is subjected to thinning out and weighting.

5. A longitudinally coupled resonator type surface acoustic wave filter according to claim 4, wherein the thinning-out and weighting is asymmetrical to the center of the longitudinally coupled resonator type surface acoustic wave filter in the surface wave propagating direction.

6. A longitudinally coupled resonator type surface acoustic wave filter according to claim 1, further comprising at least one of a surface acoustic wave resonator connected in series to the longitudinally coupled resonator type surface acoustic wave filter and a surface acoustic wave resonator connected in parallel to the longitudinally coupled resonator type surface acoustic wave filter.

7. A longitudinally coupled resonator type surface acoustic wave filter according to claim 1, further comprising a balanced input terminal or an output terminal and an unbalanced output terminal or an input terminal arranged to provide a balance-unbalance conversion function.

8. A communication apparatus comprising the longitudinally coupled resonator type surface acoustic wave filter according to claim 1.

9. A longitudinally coupled resonator type surface acoustic wave filter comprising:
   a piezoelectric substrate; and
   first, second and third IDTs provided on the piezoelectric substrate and arranged in a surface wave propagating direction such that the second IDT is interposed between the first and the third IDTs, each of the first, second and third IDTs having a plurality of electrode fingers; wherein
   the first and second IDTs have narrow electrode-finger pitch sections which have an electrode-finger pitch narrower than the remaining electrode-finger pitches, at respective end portions of the first and second IDTs adjacent to each other;
   the second and third IDTs have narrow electrode-finger pitch sections which have an electrode-finger pitch narrower than the remaining electrode-finger pitches, at respective end portions of the second and third IDTs adjacent to each other; and
   a number of the electrode fingers of the narrow electrode-finger pitch sections in the first and second IDTs is different from a number of the electrode fingers of the narrow electrode-finger pitch sections in the second and third IDTs.

10. A longitudinally coupled resonator type surface acoustic wave filter according to claim 9, wherein the second IDT has an even number of electrode fingers.

11. A longitudinally coupled resonator type surface acoustic wave filter according to claim 9, wherein at least one of the IDTs is subjected to thinning out and weighting.

12. A longitudinally coupled resonator type surface acoustic wave filter according to claim 11, wherein the thinning-out and weighting is asymmetrical to the center of the longitudinally coupled resonator type surface acoustic wave filter in the surface wave propagating direction.

13. A longitudinally coupled resonator type surface acoustic wave filter according to claim 9, further comprising at least one of a surface acoustic wave resonator connected in series to the longitudinally coupled resonator type surface acoustic wave filter and a surface acoustic wave resonator connected in parallel to the longitudinally coupled resonator type surface acoustic wave filter.

14. A longitudinally coupled resonator type surface acoustic wave filter according to claim 9, further comprising a balanced input terminal or an output terminal and an unbalanced output terminal or an input terminal arranged to provide a balance-unbalance conversion function.

15. A communication apparatus comprising the longitudinally coupled resonator type surface acoustic wave filter according to claim 9.

16. A longitudinally coupled resonator type surface acoustic wave filter comprising:
a piezoelectric substrate; and
first, second and third IDTs provided on the piezoelectric substrate and arranged in a surface wave propagating direction such that the second IDT is interposed between the first and the third IDTs, each of the first, second and third IDTs having a plurality of electrode fingers; wherein
only the first and second IDTs or only the second and third IDTs have narrow electrode-finger pitch sections which have an electrode-finger pitch narrower than the remaining electrode-finger pitches, at respective end portions of the first and second IDTs adjacent to each other, or at the respective end portions of the second and third IDTs adjacent to each other.

17. A longitudinally coupled resonator type surface acoustic wave filter according to claim 16, wherein the second IDT has an even number of electrode fingers.

18. A longitudinally coupled resonator type surface acoustic wave filter according to claim 16, wherein at least one of the IDTs is subjected to thinning out and weighting.

19. A longitudinally coupled resonator type surface acoustic wave filter according to claim 18, wherein the thinning-out and weighting is asymmetrical to the center of the longitudinally coupled resonator type surface acoustic wave filter in the surface wave propagating direction.

20. A longitudinally coupled resonator type surface acoustic wave filter according to claim 16, further comprising at least one of a surface acoustic wave resonator connected in series to the longitudinally coupled resonator type surface acoustic wave filter and a surface acoustic wave resonator connected in parallel to the longitudinally coupled resonator type surface acoustic wave filter.

21. A longitudinally coupled resonator type surface acoustic wave filter according to claim 16, further comprising a balanced input terminal or an output terminal and an unbalanced output terminal or an input terminal arranged to provide a balance-unbalance conversion function.

22. A communication apparatus comprising the longitudinally coupled resonator type surface acoustic wave filter according to claim 16.

23. A longitudinally coupled resonator type surface acoustic wave filter comprising:
a piezoelectric substrate;
a first longitudinally coupled resonator type surface acoustic wave filter unit which includes first, second and third IDTs provided on the piezoelectric substrate and arranged in a surface wave propagating direction such that the second IDT is interposed between the first and the third IDTs, each of the first, second and third IDTs having a plurality of electrode fingers;
a second longitudinally coupled resonator type surface acoustic wave filter unit which includes fourth, fifth and sixth IDTs provided on the piezoelectric substrate and arranged in a surface wave propagating direction such that the fifth IDT is interposed between the fourth and the sixth IDTs, each of the fourth, fifth and sixth IDTs having a plurality of electrode fingers; wherein
the first, second and third IDTs have narrow electrode-finger pitch sections which have an electrode-finger pitch narrower than the remaining electrode-finger pitches, at respective end portions of the first, second and third IDTs adjacent to each other;
the fourth, fifth and sixth IDTs have narrow electrode-finger pitch sections which have an electrode-finger pitch narrower than the remaining electrode-finger pitches, at respective end portions of the fourth, fifth and sixth IDTs adjacent to each other; and
the electrode-finger pitch of the narrow electrode-finger pitch sections in the first, second and third IDTs is different from the electrode-finger pitch of the narrow electrode-finger pitch sections in the fourth, fifth and sixth IDTs.

24. A longitudinally coupled resonator type surface acoustic wave filter according to claim 23, wherein a number of the electrode fingers of the narrow electrode-finger pitch sections in the first, second and third IDTs is different from a number of the electrode fingers of the narrow electrode-finger pitch sections in the fourth, fifth and sixth IDTs.

25. A longitudinally coupled resonator type surface acoustic wave filter according to claim 23, wherein the second and fifth IDTs have an even number of electrode fingers.

26. A longitudinally coupled resonator type surface acoustic wave filter according to claim 23, wherein at least one of the IDTs is subjected to thinning out and weighting.

27. A longitudinally coupled resonator type surface acoustic wave filter according to claim 26, wherein the thinning-out and weighting is asymmetrical to the center of the longitudinally coupled resonator type surface acoustic wave filter in the surface wave propagating direction.

28. A longitudinally coupled resonator type surface acoustic wave filter according to claim 23, further comprising at least one of a surface acoustic wave resonator connected in series to the longitudinally coupled resonator type surface acoustic wave filter and a surface acoustic wave resonator connected in parallel to the longitudinally coupled resonator type surface acoustic wave filter.

29. A longitudinally coupled resonator type surface acoustic wave filter according to claim 23, further comprising a balanced input terminal or an output terminal and an unbalanced output terminal or an input terminal arranged to provide a balance-unbalance conversion function.

30. A communication apparatus comprising the longitudinally coupled resonator type surface acoustic wave filter according to claim 23.

31. A longitudinally coupled resonator type surface acoustic wave filter comprising:
a piezoelectric substrate;
a first longitudinally coupled resonator type surface acoustic wave filter unit which includes first, second and third IDTs provided on the piezoelectric substrate and arranged in a surface wave propagating direction such that the second IDT is interposed between the first and the third IDTs, each of the first, second and third IDTs having a plurality of electrode fingers;

a second longitudinally coupled resonator type surface acoustic wave filter unit which includes fourth, fifth and sixth IDTs provided on the piezoelectric substrate and arranged in a surface wave propagating direction such that the fifth IDT is interposed between the fourth and the sixth IDTs, each of the fourth, fifth and sixth IDTs having a plurality of electrode fingers; wherein the first, second and third IDTs have narrow electrode-finger pitch sections which have an electrode-finger pitch narrower than the remaining electrode-finger pitches, at respective end portions of the first, second and third IDTs adjacent to each other;

the fourth, fifth and sixth IDTs have narrow electrode-finger pitch sections which have an electrode-finger pitch narrower than the remaining electrode-finger pitches, at respective end portions of the fourth, fifth and sixth IDTs adjacent to each other; and a number of the electrode fingers of the narrow electrode-finger pitch sections in the first, second and third IDTs is different from a number of the electrode fingers of the narrow electrode-finger pitch sections in the fourth, fifth and sixth IDTs.

32. A longitudinally coupled resonator type surface acoustic wave filter according to claim 31, wherein a number of the electrode fingers of the narrow electrode-finger pitch sections in the first, second and third IDTs is different from a number of the electrode fingers of the narrow electrode-finger pitch sections in the fourth, fifth and sixth IDTs.

33. A longitudinally coupled resonator type surface acoustic wave filter according to claim 31, wherein the second and fifth ITDs have even electrode fingers.

34. A longitudinally coupled resonator type surface acoustic wave filter according to claim 31, wherein at least one of the IDTs is subjected to thinning out and weighting.

35. A longitudinally coupled resonator type surface acoustic wave filter according to claim 34, wherein the thinning-out and weighting is asymmetrical to the center of the longitudinally coupled resonator type surface acoustic wave filter in the surface wave propagating direction.

36. A longitudinally coupled resonator type surface acoustic wave filter according to claim 31, further comprising at least one of a surface acoustic wave resonator connected in series to the longitudinally coupled resonator type surface acoustic wave filter and a surface acoustic wave resonator connected in parallel to the longitudinally coupled resonator type surface acoustic wave filter.

37. A longitudinally coupled resonator type surface acoustic wave filter according to claim 31, further comprising a balanced input terminal or an output terminal and an unbalanced output terminal or an input terminal arranged to provide a balance-unbalance conversion function.

38. A communication apparatus comprising the longitudinally coupled resonator type surface acoustic wave filter according to claim 31.

39. A longitudinally coupled resonator type surface acoustic wave filter comprising:

a piezoelectric substrate;

a first longitudinally coupled resonator type surface acoustic wave filter unit which includes first, second and third IDTs provided on the piezoelectric substrate and arranged in a surface wave propagating direction such that the second IDT is interposed between the first and the third IDTS, each of the first, second and third IDTs having a plurality of electrode fingers;

a second longitudinally coupled resonator type surface acoustic wave filter unit which includes fourth, fifth and sixth IDTs provided on the piezoelectric substrate and arranged in a surface wave propagating direction such that the fifth IDT interposed between the fourth and the sixth IDTs, each of the fourth, fifth and sixth IDTs having a plurality of electrode fingers; wherein only the first, second and third IDTs or only the fourth, fifth and sixth IDTs have narrow electrode-finger pitch sections which have an electrode-finger pitch that is narrower than the remaining electrode-finger pitches, at respective end portions of the first, second and third IDTs adjacent to each other, or at respective end portions of the fourth, fifth and sixth IDTs adjacent to each other.

40. A longitudinally coupled resonator type surface acoustic wave filter according to claim 39, wherein the second and fifth IDTs have an even number of electrode fingers.

41. A longitudinally coupled resonator type surface acoustic wave filter according to claim 39, wherein at least one of the IDTs is subjected to thinning out and weighting.

42. A longitudinally coupled resonator type surface acoustic wave filter according to claim 41, wherein the thinning-out and weighting is asymmetrical to the center of the longitudinally coupled resonator type surface acoustic wave filter in the surface wave propagating direction.

43. A longitudinally coupled resonator type surface acoustic wave filter according to claim 39, further comprising at least one of a surface acoustic wave resonator connected in series to the longitudinally coupled resonator type surface acoustic wave filter and a surface acoustic wave resonator connected in parallel to the longitudinally coupled resonator type surface acoustic wave filter.

44. A longitudinally coupled resonator type surface acoustic wave filter according to claim 39, further comprising a balanced input terminal or an output terminal and an unbalanced output terminal or an input terminal arranged to provide a balance-unbalance conversion function.

45. A communication apparatus comprising the longitudinally coupled resonator type surface acoustic wave filter according to claim 39.

* * * * *